(12) United States Patent
Lunsman et al.

(10) Patent No.: US 11,800,682 B2
(45) Date of Patent: Oct. 24, 2023

(54) COOLING MODULE AND A METHOD OF ASSEMBLING THE COOLING MODULE TO AN ELECTRONIC CIRCUIT MODULE

(71) Applicant: HEWLETT PACKARD ENTERPRISE DEVELOPMENT LP, Houston, TX (US)

(72) Inventors: Harvey J. Lunsman, Chippewa Falls, WI (US); Tahir Cader, Liberty Lake, WA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 78 days.

(21) Appl. No.: 17/541,477

(22) Filed: Dec. 3, 2021

(65) Prior Publication Data
US 2023/0180432 A1    Jun. 8, 2023

(51) Int. Cl.
*H05K 7/20* (2006.01)
*H01L 23/46* (2006.01)
*H05K 1/02* (2006.01)
*H01L 23/473* (2006.01)

(52) U.S. Cl.
CPC ....... *H05K 7/20272* (2013.01); *H01L 23/473* (2013.01); *H05K 1/0203* (2013.01)

(58) Field of Classification Search
None
See application file for complete search history.

(56) References Cited

U.S. PATENT DOCUMENTS

| 5,367,253 | A | 11/1994 | Wood et al. |
|---|---|---|---|
| 7,420,808 | B2 | 9/2008 | Campbell et al. |
| 7,883,266 | B2 | 2/2011 | Campbell et al. |
| 7,978,472 | B2 | 7/2011 | Campbell et al. |
| 8,014,150 | B2 | 9/2011 | Campbell et al. |
| 8,018,720 | B2 | 9/2011 | Campbell et al. |
| 8,027,162 | B2 | 9/2011 | Campbell et al. |
| 8,203,842 | B2 * | 6/2012 | Campbell .......... H05K 7/20772 165/80.4 |
| 8,387,249 | B2 | 3/2013 | Campbell et al. |

(Continued)

FOREIGN PATENT DOCUMENTS

WO    WO-2018045052    3/2018

*Primary Examiner* — Courtney L Smith
(74) *Attorney, Agent, or Firm* — Hewlett Packard Enterprise Patent Department

(57) ABSTRACT

Example implementations relate to a cooling module of a circuit assembly having a frame and an electronic circuit module including first and second chipsets, and a method of assembling the cooling module. The cooling module includes first and second cooling components. The first cooling component is connectable to the frame to establish a first thermal interface between the first cooling component and the first chipset. The first cooling component is positioned within a recess portion of the second cooling component, and each connector of a pair of second fluid connectors in the second cooling component is movably connected to a respective connector of a pair of first fluid connectors in the first cooling component to establish a fluid-flow path between the first and second cooling components. The second cooling component is connectable to the frame to establish a second thermal interface between the second cooling component and the second chipset.

20 Claims, 14 Drawing Sheets

(56) References Cited

U.S. PATENT DOCUMENTS

| | | |
|---|---|---|
| 10,182,514 B2 | 1/2019 | Hoffmeyer et al. |
| 10,866,376 B1 | 12/2020 | Ghiasi |
| 10,980,154 B1 | 4/2021 | Gao |
| 11,019,752 B2* | 5/2021 | Gao .................. H05K 7/20272 |
| 11,547,022 B2* | 1/2023 | Gao .................. H05K 7/20272 |
| 11,606,885 B2* | 3/2023 | Gao .................. H05K 7/20781 |
| 11,646,244 B2* | 5/2023 | Klein .................. H01L 23/4006 |
| | | 439/55 |
| 2007/0227709 A1 | 10/2007 | Upadhya et al. |
| 2010/0254758 A1 | 10/2010 | Campbell et al. |
| 2019/0221499 A1* | 7/2019 | Chang .................. F28D 9/0093 |
| 2019/0252286 A1 | 8/2019 | Peterson et al. |
| 2020/0098724 A1 | 3/2020 | Liff et al. |
| 2020/0146183 A1 | 5/2020 | Lofgreen et al. |
| 2021/0105911 A1* | 4/2021 | Yang .................. H05K 7/20509 |
| 2021/0118756 A1 | 4/2021 | Wan et al. |
| 2022/0046826 A1* | 2/2022 | Heydari ............. H05K 7/20254 |
| 2022/0418156 A1* | 12/2022 | Cushen ............. H05K 7/20509 |

* cited by examiner

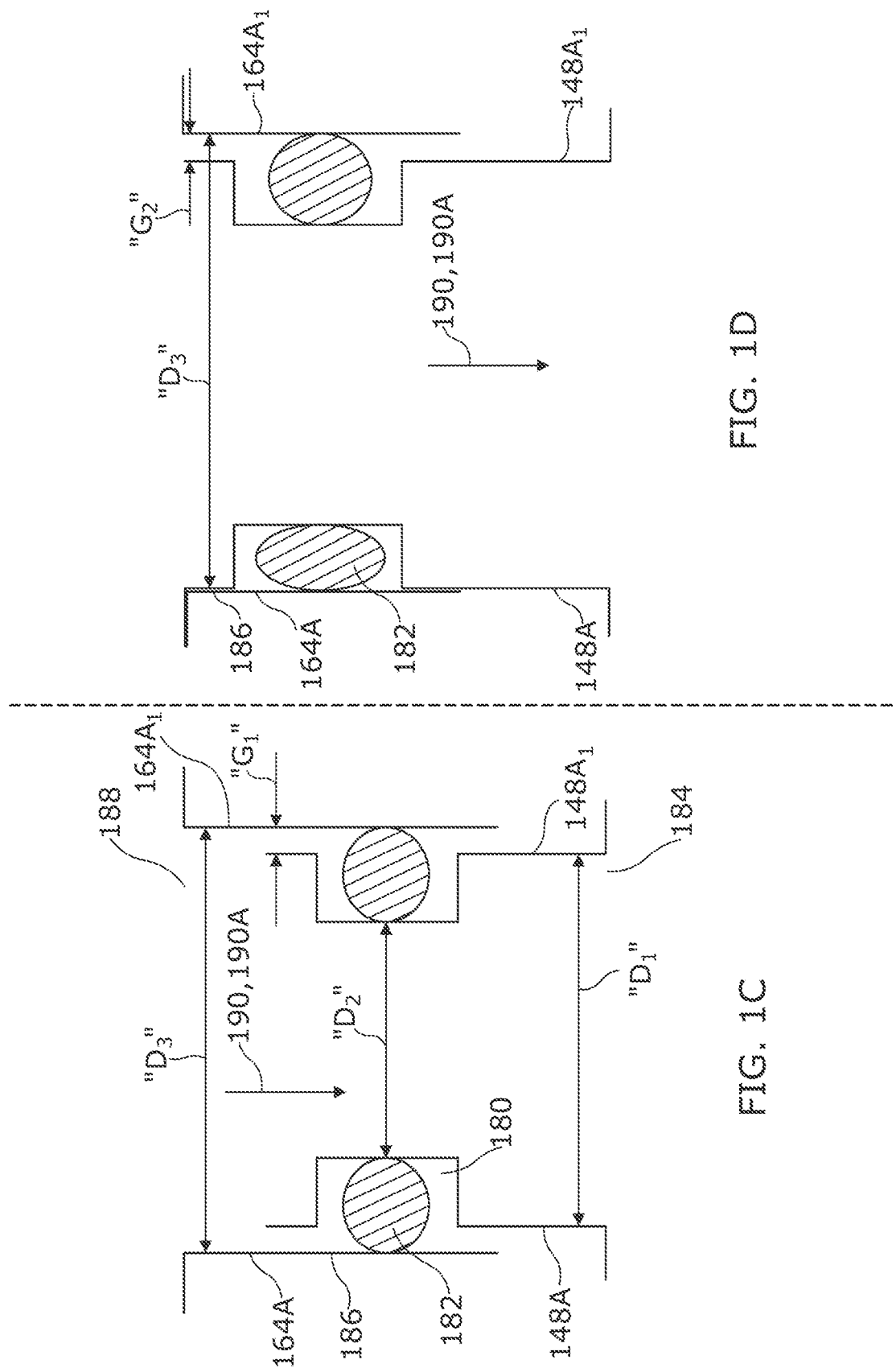

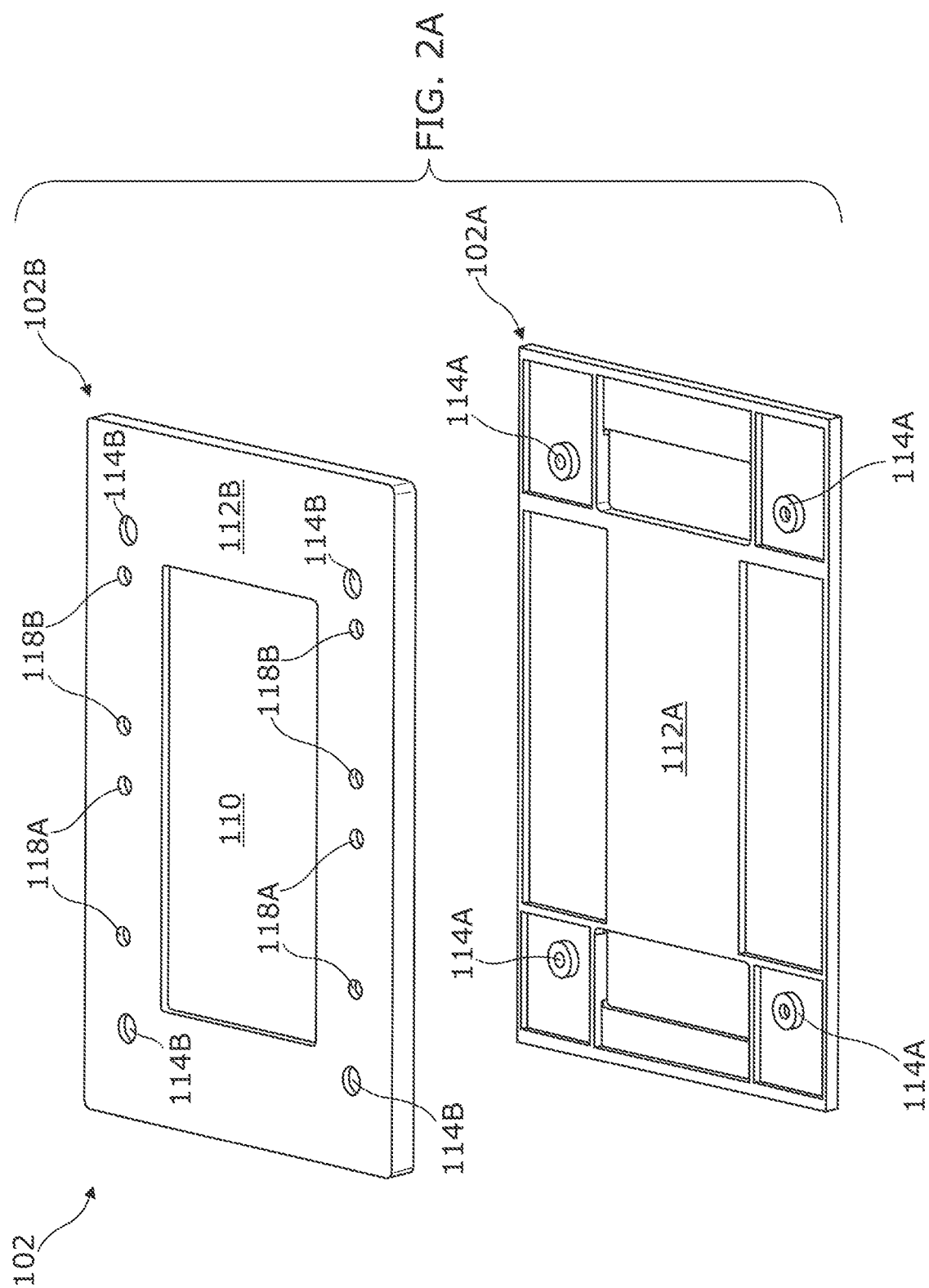

COOLING MODULE AND A METHOD OF ASSEMBLING THE COOLING MODULE TO AN ELECTRONIC CIRCUIT MODULE

CROSS REFERENCE

This application is related to a co-pending U.S. application titled "cooling module and a method of cooling an electronic circuit module using the cooling module" filed on "Dec. 3, 2021" (U.S. application Ser. No. 17/541,499), and is assigned to Hewlett Packard Enterprise Development LP.

BACKGROUND

An electronic system generally include one or more circuit assemblies, each having at least one electronic circuit module. Typically, an electronic circuit module includes a circuit board and chipsets (e.g., one or more electronic chips) disposed on the circuit board. These electronic chips may generate waste-heat during their operation. If the waste-heat is not dissipated from the electronic circuit module, the waste-heat may exceed thermal specifications of the electronic chips, thus resulting in degraded performance, reliability, and life expectancy of the electronic circuit module having such electronic chips, and in some cases the failure of the circuit assembly having such electronic circuit module. In order to minimize such adverse effects of the waste-heat, the electronic system may include a thermal management system for circulating a fluid (e.g., a cool fluid) to a cooling module of the circuit assembly to draw the waste-heat away from the electronic chips of the electronic circuit module.

BRIEF DESCRIPTION OF THE DRAWINGS

Various examples will be described below with reference to the following figures.

FIG. 10 illustrates a cross sectional view of a first connector of a pair of first fluid connectors having an O-ring, movably connected to another first connector of a pair of second fluid connectors of FIGS. 1A-1B according to an example implementation of the present disclosure.

FIG. 1D illustrates a cross sectional view of a first connector of a pair of first fluid connectors having an O-ring, movably connected to another first connector of a pair of second fluid connectors of FIGS. 1A-1B according to another example implementation of the present disclosure.

FIG. 2A illustrates an exploded perspective view of a frame of the circuit assembly of FIGS. 1A-1B according to an example implementation of the present disclosure.

DETAILED DESCRIPTION

Figure 1A:
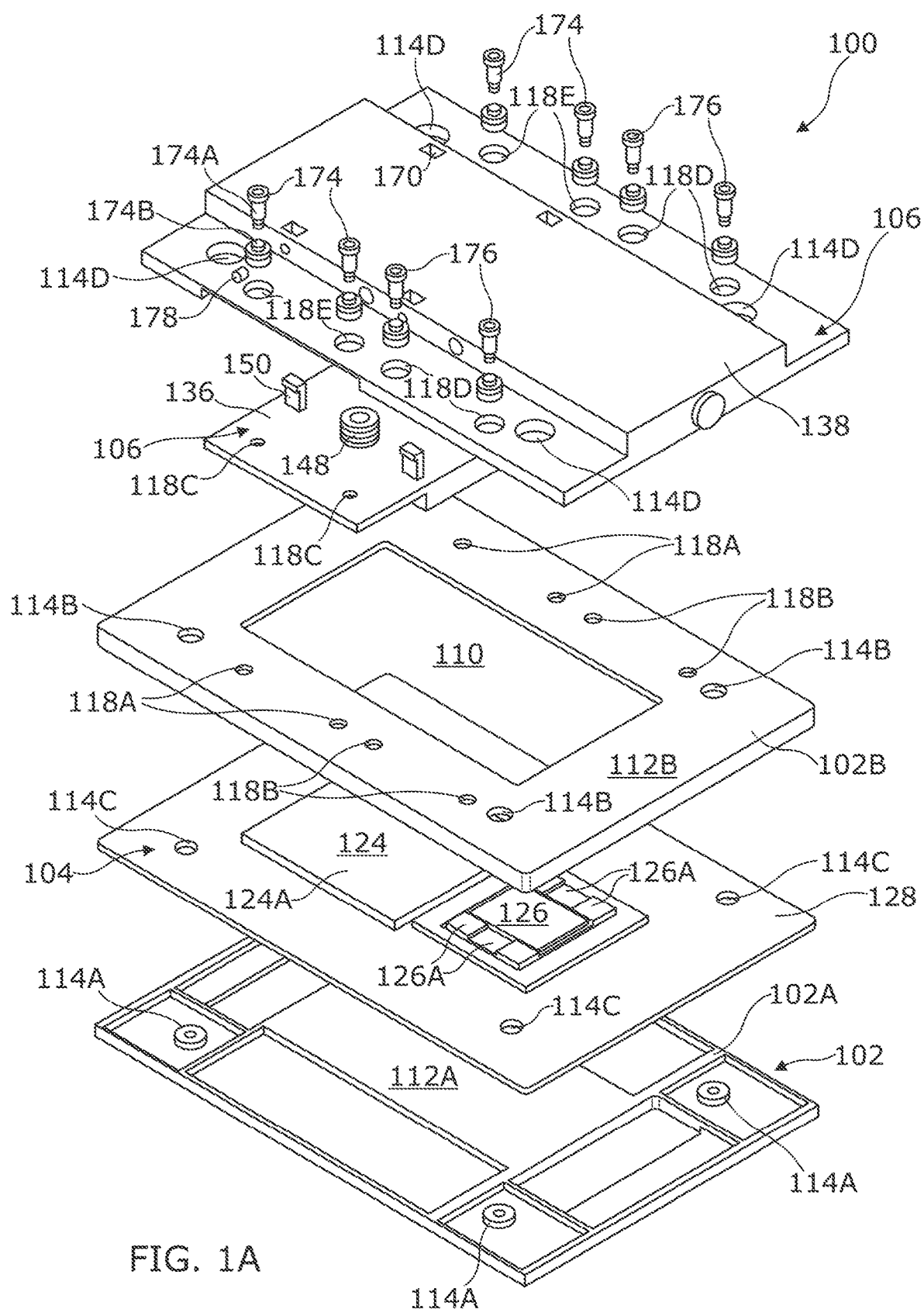
FIG. 1A illustrates an exploded perspective view of a circuit assembly according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening element, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

As used herein, the term "fluid connector" may refer to a type of a mechanical coupler, which movably connects to another mechanical coupler so as to fluidically connect at least two fluid chambers to one another. As used herein the term "movably connected" or "movable connection" may refer to a non-rigid fluid connection formed between two fluid connectors, where one of the fluid connectors may move 3-dimensionally relative to the other fluid connector, while maintaining a leak-proof fluid-flow path therebetween. As used herein the term "tool-less" design may refer to a type of design incorporated in the fluid connectors that enables the fluid connectors to be movably connected to one another without the need for any tools. As used herein the term "cooling component" may refer to a type of a thermal conductive component, which includes an internal channel (or microchannel) through which a cool fluid is directed to absorb a waste-heat transferred to the cooling component by a waste-heat producing component, for example, one or more electronic chipsets disposed on the circuit board. For example, the cooling component may also be referred to as a cold plate. The term "fluid" may refer to a liquid medium or a gaseous medium of the coolant or combinations thereof. Further, the term "plugging-in" may refer to connecting the fluid connectors (e.g., a fluid bore or a fluid piston) to each other by way of pushing or inserting one of the fluid bore or the fluid piston into the other one of the fluid bore or the fluid piston. Similarly, the term "plugging-out" may refer to disconnecting the fluid connectors from each other by way of pulling or extracting one of the fluid bore or the fluid piston from the other one of the fluid bore or the fluid piston. Further, as used herein, the term "thermal interface" may refer to surfaces of two components, which are directly in contact with each other or indirectly in contact with each other through a thermal interface material (TIM) to promote the transfer of the waste-heat from one component to the other component. As used herein, the term "height" may refer to a tallness of an electronic chip from a bottom surface to a top surface of the electronic chip or from the bottom surface of the circuit board to the top surface of the electronic chip. As used herein the term "flatness" may refer to an even surface (or a level surface or a uniform surface) of an electronic chip or a co-planarity between two electronic chips (for example, between the top surfaces) minimizing raised areas or indentations. For example, the electronic chip may have an even top surface, when it has uniform height.

It may be noted herein: an object, device, or assembly (which may include multiple distinct bodies that are thermally coupled, and may include multiple different materials), is "thermally conductive" between two thermal interfaces if any one of the following is true: (i) a heat transfer co-efficient between the thermal interfaces is above 5 W/m²K at any temperature between 0° C. and 100° C., (ii) the object includes a material that has a thermal conductivity (often denoted k, λ, or κ) between the two interfaces between 1 W/mK to 300 W/mK at any temperature between 0° C. and 100° C., or (iii) the object is a heat pipe, vapor chamber, body of copper, or body of aluminum. Examples of materials whose thermal conductivity is between 1 W/mK to 300 W/mK at any temperature between 0° C. and 100° C. include certain types of copper, aluminum, silver, and gold, for example.

For purposes of explanation, certain examples are described with reference to the components illustrated in FIGS. 1-6. The functionality of the illustrated components may overlap, however, and may be present in a fewer or greater number of elements and components. Moreover, the disclosed examples may be implemented in various environments and are not limited to the illustrated examples. Further, the sequence of operations described in connection with FIGS. 4 and 6 is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

Electronic systems including, but not limited to, computers, server systems, storage systems, wireless access points, network switches, routers, docking stations, printers, or scanners include circuit assemblies, each having one or more electronic circuit modules. An electronic circuit module includes several chipsets disposed on a circuit board, such as, a printed circuit board. Each chipset may include one or more electronic chips (or electronic components or integrated circuit chips). Examples of the electronic chips may include, but are not limited to, central processing unit (CPU) chips, graphics processing unit (GPU) chips, power supply chips, memory chips, or electronic elements, such as capacitors, inductors, resistors, or the like. During operation of a circuit assembly, the electronic chips of the electronic circuit module may generate waste-heat (or heat). As will be understood, such waste-heat is unwanted, and may have impact on the operation of the electronic circuit module. For example, the waste-heat may cause physical damage to the electronic chips, degrade performance, reliability, or life expectancy of the electronic circuit module having such electronic chips, and in some cases the waste-heat may even cause failure of the circuit assembly.

In order to minimize the adverse effects of the waste-heat, some electronic systems include a thermal management system to draw (or remove) the waste-heat away from the electronic chips. In some implementations, the thermal management system includes cooling modules that entail use of a cooling component (e.g., at least one of a heat sink or a cold plate) for removing the waste-heat from the electronic chips. For example, the cooling component is disposed in contact (e.g., in a direct physical contact) with the electronic chips disposed on the circuit board to establish a thermal interface between the cooling component and the electronic chips. Accordingly, such cooling component absorbs the waste-heat generated by the electronic chips, and transfers the absorbed waste-heat away from the electronic chips.

In certain designs of the electronic circuit modules, the electronic chips may have varied height resulting in an uneven topology or a non-uniform topology of top surfaces of the electronic chips. Accordingly, in such implementations, the electronic chips disposed on the circuit board may have different heights from the circuit board. Thus, the top surfaces of the electronic chips may be positioned at different heights. In some other implementations, even though the electronic chips disposed on the circuit board may have same heights, the top surfaces of the electronic chips may be positioned at different heights due to one or more of soldering imperfections and variations in applied pressures on the electronic chips by the cooling component to establish the thermal interface therebetween. In certain other designs of the electronic circuit modules, some electronic chips may have varying flatness (i.e., a non-uniform surface or an uneven surface) due to design tolerances along their top surfaces, resulting in the non-uniform topology or the uneven topology of the top surfaces of the electronic chips. Accordingly, in such implementations, the electronic chips disposed on the circuit board may have uneven topology.

Consequently, when a common cooling component (i.e., a single cooling component) is used in the electronic circuit module having such uneven topology among the top surfaces of the electronic chips disposed thereon, the common cooling component cannot be disposed in consistent contact with the top surfaces of all electronic chips to establish a consistent thermal interface therebetween. For example, such a common cooling component cannot come in contact with the electronic chips having a lower height. Similarly, even when a common cooling component having varied height (e.g., a complementary height to that of varied height electronic chips) is used in the electronic circuit module having varied height electronic chips, the common cooling component cannot be disposed in contact with the top surfaces of the electronic chips to establish the thermal interface therebetween. For example, such common cooling component cannot make consistent contact with the electronic chips having uneven topology.

Accordingly, any variations in at least one of the height or the flatness among the electronic chips in a module may result in inefficient cooling, and consequently varying chip temperatures across the electronic circuit module. In other words, the common cooling component may not effectively perform cooling of the electronic chips with at least one of varied height or flatness. Further, any improper installation of the common cooling component on the electronic chips with at least one of varied height or flatness, may result in damaging some electronic chips. For example, the common cooling component may not apply a uniform pressure on all electronic chips to establish a thermal interface therebetween, thus resulting in damage, such as cracking of some of the electronic chips.

One way in which the electronic industry is trying to address the aforementioned issues with common cooling components is by using a discrete (or a separate) cooling component for each electronic chip instead of a common cooling component for all electronic chips. However, a cooling module having such discrete cooling components may increase factory installation complexity and field and factory serviceability challenges. For example, the circuit assembly may require substantial plumbing modifications to include discrete cooling components (e.g., separate cold plates) for each electronic chip. In some implementations, the modifications may include i) drawing multiple flowlines into and out of each cooling component, and ii) implementing a discrete fluid inlet connector and a discrete fluid outlet connector for each cooling component. Additionally, during a service or an installation event, technicians may need to follow complicated processes to complete the connection (or disconnection) of the discrete fluid inlet and outlet of each cooling component, to a respective flowline of the multiple flowlines.

Further, in some implementations, the cooling modules may further entail use of gap pads along with the cooling components to address the issues with the electronic chips having at least one of varied height or flatness. For example, the gap pad may be disposed between the electronic chip and the respective cooling component to bridge at least one of the height differences or flatness differences between the electronic chips and the respective cooling component. However, the gap pads may have low thermal conductivity resulting in inefficient cooling of the electronic chips. Thus, the electronic chips that remain heated (e.g., not properly cooled) may cause conduction of the waste-heat via a substrate of the circuit board. Such conduction of the waste-heat via the substrate of the circuit board may cause heating of one or more of the rest of the electronic elements of the electronic module, for example, a die-to-die heating of the rest of the electronic chips.

In accordance with aspects of the present disclosure, an improved cooling module is provided for electronic circuit modules of a circuit assembly that mitigates one or more challenges noted hereinabove. For example, the improved cooling module includes a first cooling component and a second cooling component, where the first cooling component is positioned within a recess portion of the second cooling component to fluidically connect the first and second cooling components to one another. In some examples, the first cooling component is mounted on a frame of the circuit assembly supporting the electronic circuit module, to establish a first thermal interface with a first electronic chipset of the electronic circuit module. Similarly, the second cooling component is mounted on the frame of the circuit assembly to fluidically connect with the first cooling component, and establish a second thermal interface with a second electronic chipset of the electronic circuit module. In such examples, the second cooling component may independently move (e.g., float) 3-dimensionally relative to the first cooling component, upon mounting of the second cooling component to the frame, to accommodate variations in at least one of a height or a flatness between the first and second electronic chipsets. In some examples, the second cooling component may tilt relative to the first cooling component to align with a surface of the first cooling component to accommodate the variation in the flatness between the first and second electronic chipsets. In some other example, the second cooling component may move up and down relative to the first cooling component to accommodate the variation in the height between the first and second electronic chipsets. In one or more examples, the second cooling component may tilt relative to the first cooling component to accommodate variation in the flatness between the first and second electronic chipsets, move up and down relatively to the first cooling component to accommodate variation in the height between the first and second electronic chipsets, or a combination thereof.

In some examples, the cooling module may include a plurality of first and second spring loaded fasteners to connect the first and second cooling components respectively, to the frame. In such examples, each spring in the plurality of first spring loaded fasteners may individually bias the first cooling component to move towards the first electronic chipset to adequately establish the first thermal interface with the first electronic chipset. Similarly, each spring in the plurality of second spring loaded fasteners may individually bias the second cooling component to move towards the second electronic chipset to adequately establish the second thermal interface with the second electronic chipset.

In some examples, the first cooling component includes a pair of first fluid connectors and the second cooling component includes a pair of second fluid connectors. In such examples, each connector of the pair of first fluid connectors is movably connected to a respective connector of the pair of second fluid connectors to establish a fluid-flow path between the first and second cooling components. In some examples, each connector of the pair of first fluid connectors is one of a fluid piston or a fluid bore, whereas each connector of the pair of second fluid connectors is the other one of the fluid piston or the fluid bore. In such examples, the cooling module further includes an O-ring seal disposed in an outer circumferential groove of the fluid piston. In one or more examples, the O-ring seal may contact a wall (i.e., be compressed against the wall) of the fluid bore, when the fluid piston is movably connected to the fluid bore to establish the fluid-flow path between the first and second cooling components, so as to prevent leakage of a fluid (cool fluid or hot fluid) from the fluid-flow path. In some examples, the O-ring seal (in the compressed state against the wall) may slide along the wall (inner wall) of the fluid bore by an up and down movement of the second cooling component relative to the first cooling component. In some other examples, the O-ring seal is eccentrically compressed against the wall (inner wall) of the fluid bore by a tilting movement of the second cooling component relative to the first cooling component. In other words, when the second cooling component is tilted to accommodate variations in the flatness between the first and second electronic chipset, the O-ring seal may get eccentrically compressed by a displacement of the second cooling component relative to the second electronic chipset. In one or more examples, the O-ring seal slides along the wall of the fluid bore by the up and down movement of the second cooling component relative to the first cooling component, eccentrically compresses against the wall of the fluid bore by the tilting movement of the second cooling component relative to the first cooling component, or a combination thereof.

Since one cooling component moves (e.g., floats) independently relative to another cooling component, the cooling module may establish sufficient thermal interface between the cooling component and the electronic chipset to enable efficient heat transfer from the electronic chipset to the cooling component irrespective of variations in the height and the flatness between the electronic chipsets. Further, since each connector in the pair of the first fluid connectors or in the pair of second fluid connectors has the O-ring seal, one cooling component may be permitted to independently move relative to the other cooling component. In other words, the O-ring seal may permit a 3-dimensional movement of one cooling component relative to the other cooling component in order to accommodate the variations in at least one of the height or the flatness between the first and second electronic chipsets.

Accordingly, the present disclosure describes example implementations of a cooling module for an electronic circuit module of a circuit assembly, and a method of installing the cooling module to the electronic circuit module. The cooling module includes a first cooling component and a second cooling component. The first cooling component includes a pair of first fluid connectors, and the second cooling component includes a recess portion and a pair of second fluid connectors. The first cooling component is connectable to a frame of the circuit assembly, supporting the electronic circuit module, to establish a first thermal interface between the first cooling component and a first chipset of the electronic circuit module. The second cooling component is mounted on the frame such that the first cooling component is positioned within the recess portion, and each connector of the pair of second fluid connectors is movably connected to a respective connector of the pair of first fluid connectors to establish a fluid-flow path between the first and second cooling components. Further, the second cooling component is connectable to the frame to establish a second thermal interface between the second cooling component and a second chipset.

Figure 1B:
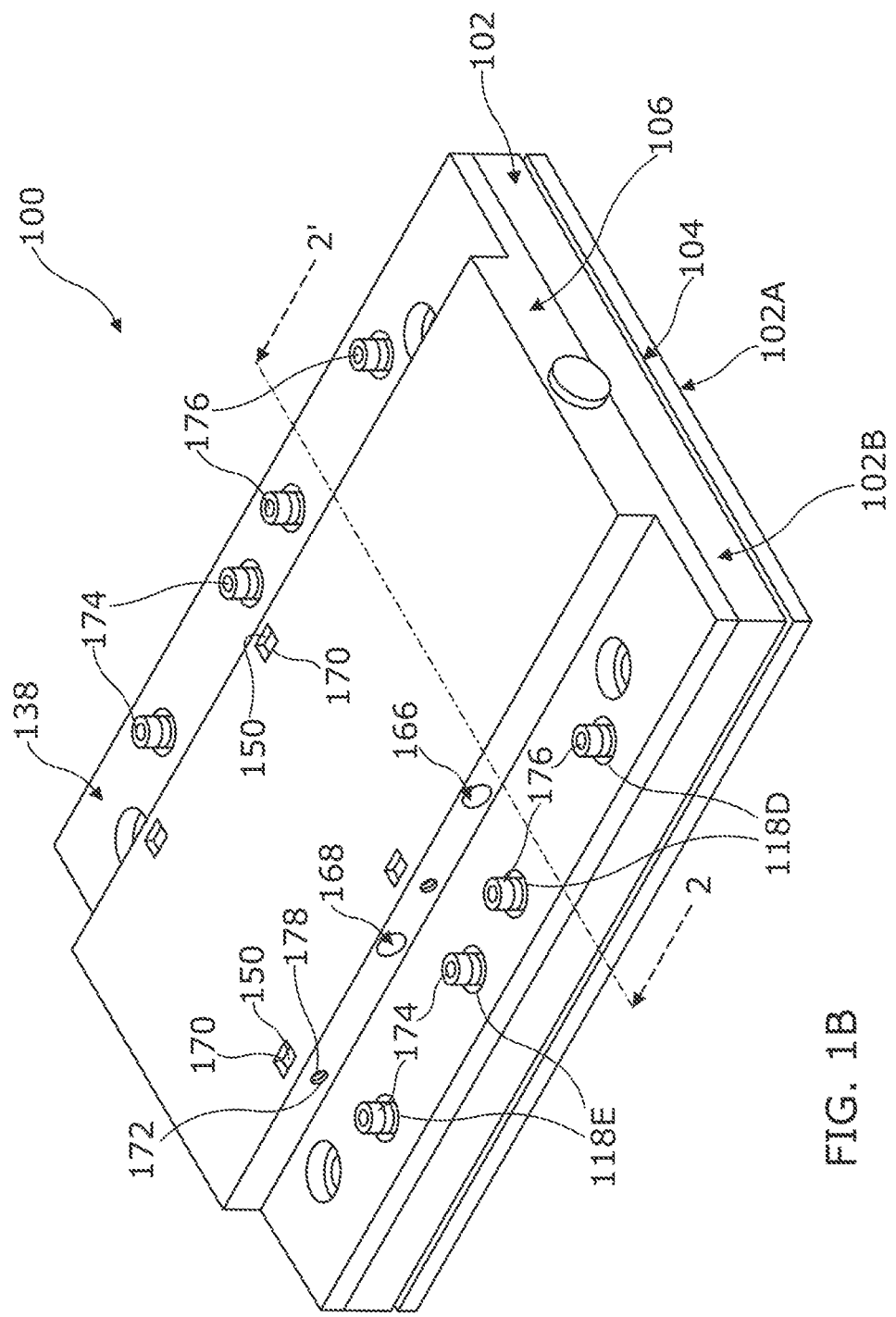
FIG. 1B illustrates an assembled perspective view of the circuit assembly of FIG. 1A according to an example implementation of the present disclosure.

Turning to the Figures, FIG. 1A depicts an exploded perspective view of a circuit assembly 100. FIG. 1B depicts an assembled perspective view of the circuit assembly 100 of FIG. 1A. FIG. 1C depicts a cross sectional view of one connector 148A of a pair of first fluid connectors 148 having an O-ring seal 182, movably connected to another first connector 164A of a pair of second fluid connectors 164 of FIGS. 1A-1B in accordance to one example of the present disclosure. FIG. 1D depicts a cross sectional view of one connector 148A of the pair of first fluid connectors 148 having the O-ring seal 182, movably connected to the other first connector 164A of the pair of second fluid connectors 164 of FIGS. 1A-1B in accordance to another example of the present disclosure. In the description hereinafter, the Figures, FIGS. 1A-1D and FIGS. 2A-2G are described concurrently for ease of illustration.

The circuit assembly 100 may function as an electronic package unit configured to provide mechanical protection to an electronic circuit module 104, dissipate waste-heat from the electronic circuit module 104, and distribute electrical energy for the functioning of the electronic circuit module 104 to execute at least one workload. In some examples, the circuit assembly 100 includes a frame 102, the electronic circuit module 104, and a cooling module 106. In one or more examples, the circuit assembly 100 may be disposed within an electronic system, such as, but not limited to, a server system, a storage system, an access point, a network switch, a router, a docking station, a printer, or a scanner to execute the at least one workload. In certain examples, the circuit assembly 100 is a compute node of the electronic system, such as a server system. In such examples, a plurality of compute nodes may be disposed within a chassis of the server system, and a plurality of such server systems may be deployed in an enclosure or a rack or a tray of a datacenter environment (not shown) to execute a plurality of workloads. As discussed herein, the circuit assembly 100 includes the electronic circuit module 104 coupled to the frame 102, and the cooling module 106 assembled to the electronic circuit module 104 and connected to the frame 102.

Referring to FIGS. 1A-1B, the frame 102 may function as a stiffener and a heat transfer plate of the circuit assembly 100. In some examples, the frame 102 includes a base portion 102A and a cover portion 102B. FIG. 2A in particular depicts an exploded perspective view of the frame 102. In some examples, the base portion 102A is an open-box shaped element. In such examples, the base portion 102A has a floor section 112A for supporting a circuit board 128 (as shown in FIG. 1A) of the electronic circuit module 104. The floor section 112A of the base portion 102A includes a plurality of first clamping holes 114A. Further, the base portion 102A may include a plurality of retainer holes (not shown) formed in the floor section 112A. In such examples, the plurality of retainer holes may be used to clamp the frame 102 to the electronic system. In some examples, the cover portion 102B is another open-box shaped element. In such examples, the cover portion 102B has an opening 110 formed in a lid section 112B of the cover portion 102B. For example, the opening 110 may be formed substantially at a center portion of the lid section 112B. Additionally, the lid section 112B includes a plurality of first holes 118A, a plurality of second holes 118B, and a plurality of second clamping holes 114B. In some examples, each hole of the plurality of second clamping holes 114B is aligned to a respective hole of the plurality of first clamping holes 114A in the base portion 102A. In one or more examples, the cover portion 102B may be mounted on and coupled to the base portion 102A to form the frame 102.

Figure 2B:
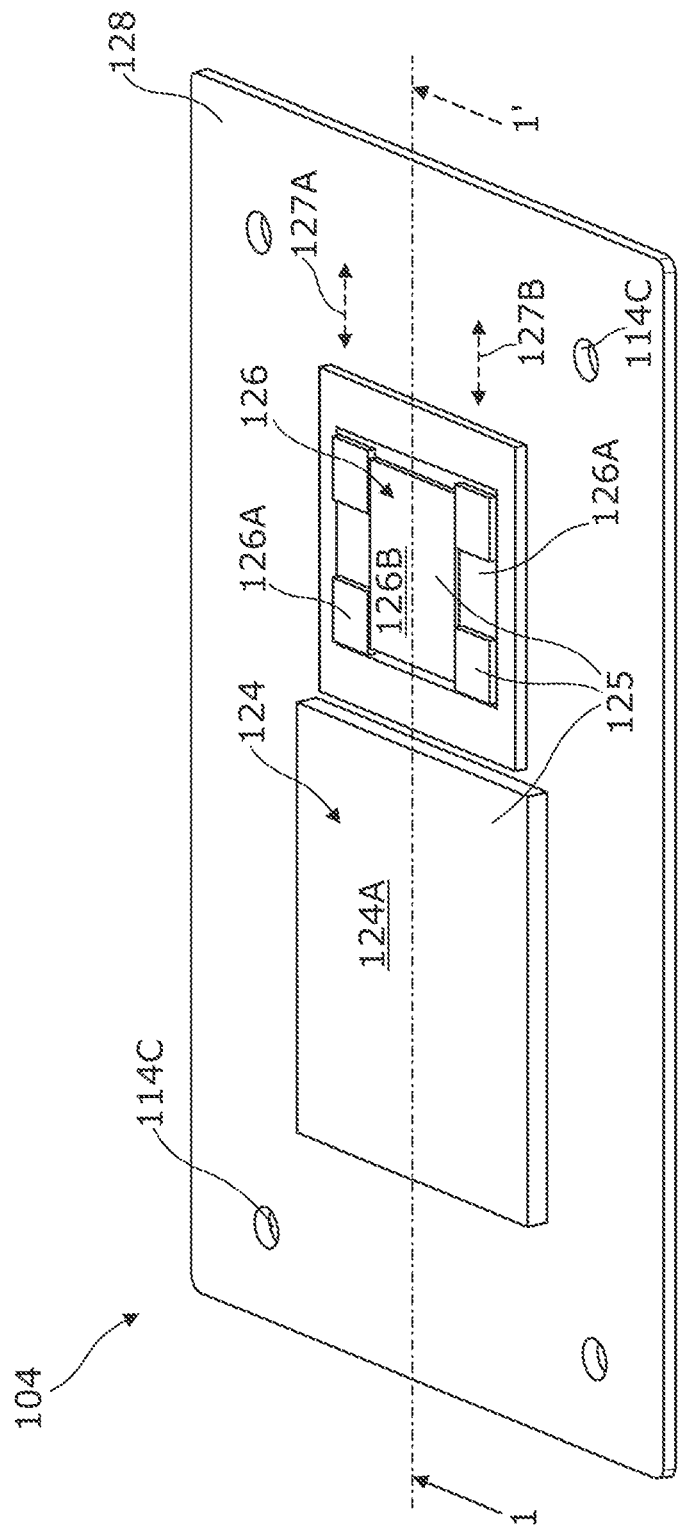
FIG. 2B illustrates a perspective view of an electronic circuit module of the circuit assembly of FIGS. 1A-1B according to an example implementation of the present disclosure.

Referring to FIGS. 1A-1B, the electronic circuit module 104 may function as a multi-chip module of the circuit assembly 100. In some examples, the electronic circuit module 104 includes a first chipset 124 (or first electronic chipset), a second chipset 126 (or second electronic chipset), and a circuit board 128. FIG. 2B in particular depicts a perspective view of the electronic circuit module 104. In some examples, the circuit board 128 may be a printed circuit board (PCB) that includes several electrical conductive traces (not shown) to electrically interconnect the first and second electronic chipsets 124, 126, respectively. In some examples, the first and second electronic chipsets 124, 126 respectively, are positioned adjacent to each other, and disposed on and coupled to the circuit board 128. For example, the first and second electronic chipsets 124, 126 may be coupled to the circuit board 128 by solder joints. In some examples, the first electronic chipset 124 includes a first electronic chip 124A. Similarly, the second electronic chipset 126 includes a plurality of second electronic chips 126A and a third electronic chip 126B. It may be noted herein that the first electronic chip 124A, the plurality of second electronic chips 126A, and the third electronic chip 126B may be collectively referred to as electronic chips 125 (as labeled in FIG. 2B). Examples of the electronic chips 125 may include, but are not limited to, central processing unit (CPU) chips, graphics processing unit (GPU) chips, power supply chips, memory chips, or other electronic elements, such as capacitors, inductors, resistors, or the like. In the illustrated example, the first electronic chip 124A is a processor (CPU) chip, each of the plurality of second electronic chips 126A is a memory chip, and the third electronic chip 126B is a graphics (GPU) chip. In the example of FIG. 2B, the plurality of second electronic chips 126A is arranged along a first row 127A and a second row 127B located around the third electronic chip 126B. It is to be noted that the electronic circuit module 104 may include various combinations of different types of electronic chips 125, without limiting the scope of the present disclosure. Further, while the electronic circuit module 104 is shown to include three types of electronic chips 125 arranged in a specific fashion, the scope of the present disclosure is not limited with respect to the number or types of electronic chips 125 and the manner in which the electronic chips 125 are laid out on the circuit board 128. The circuit board 128 additionally includes a plurality of third clamping holes 114C, each aligned to respective holes of the plurality of first and second clamping holes 114A, 114B respectively, of the frame 102.

Figure 2C:
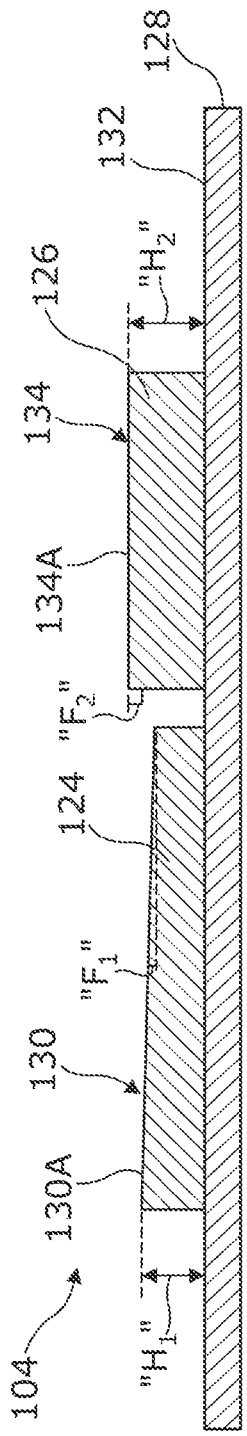
FIG. 2C illustrates a cross sectional view of the electronic circuit assembly taken along line 1-1' of FIG. 2B according to an example implementation of the present disclosure.

FIG. 2C in particular depicts a cross sectional view of the electronic circuit module 104 taken along line 1-1' in FIG. 2B. The first electronic chipset 124 (e.g., the first electronic chip 124A) may have a varied flatness "$F_1$" along its top surface 130. In some examples, the varied flatness "$F_1$" may be about −5 degrees. Further, the first electronic chipset 124 may have a first height "$H_1$" from a top surface 132 of the circuit board 128. Similarly, the second electronic chipset 126 (e.g., the plurality of second electronic chips 126A and/or the third electronic chip 126B) may have an even flatness "$F_2$" along its top surface 134. For example, the even flatness "$F_2$" is about 0 degrees. Further, the second electronic chipset 126 may have a second height "$H_2$" from the top surface 132 of the circuit board 128. In the illustrated example of FIG. 2C, the second height "$H_2$" is greater than the first height "$H_1$". Accordingly, in the illustrated example, the first and second electronic chipsets 124, 126 respectively have varied height and flatness. In one or more examples, the top surface 130 of the first electronic chipset 124 is a first thermal interfacing surface 130A of the electronic circuit module 104, and the top surface 134 of the second electronic chipset 126 is a second thermal interfacing surface 134A of the electronic circuit module 104.

Figure 5A:
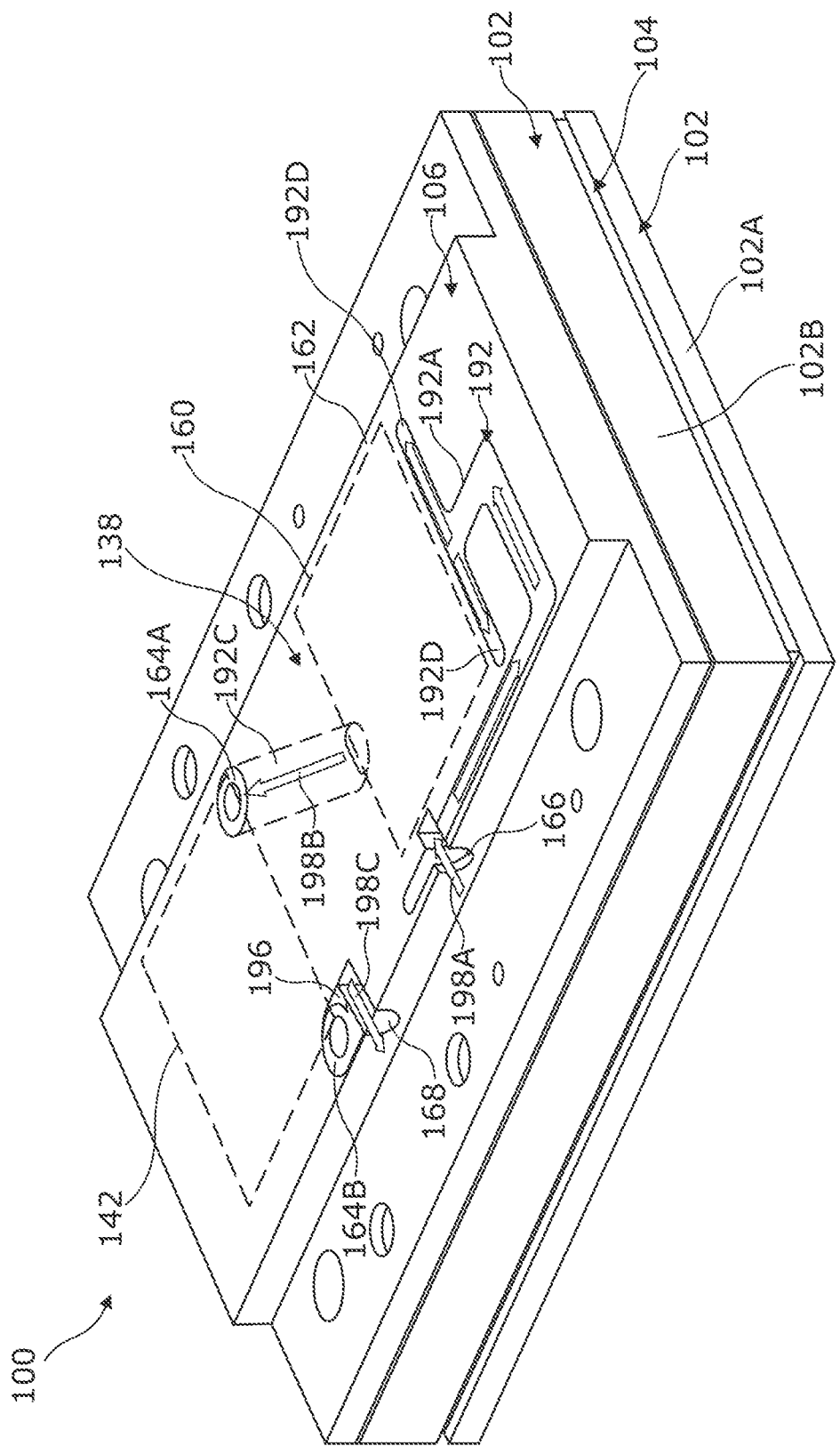
FIG. 5A illustrates a cross sectional top view of the circuit assembly taken along line 2-2' of FIG. 1B according to an example implementation of the present disclosure.
Figure 5B:
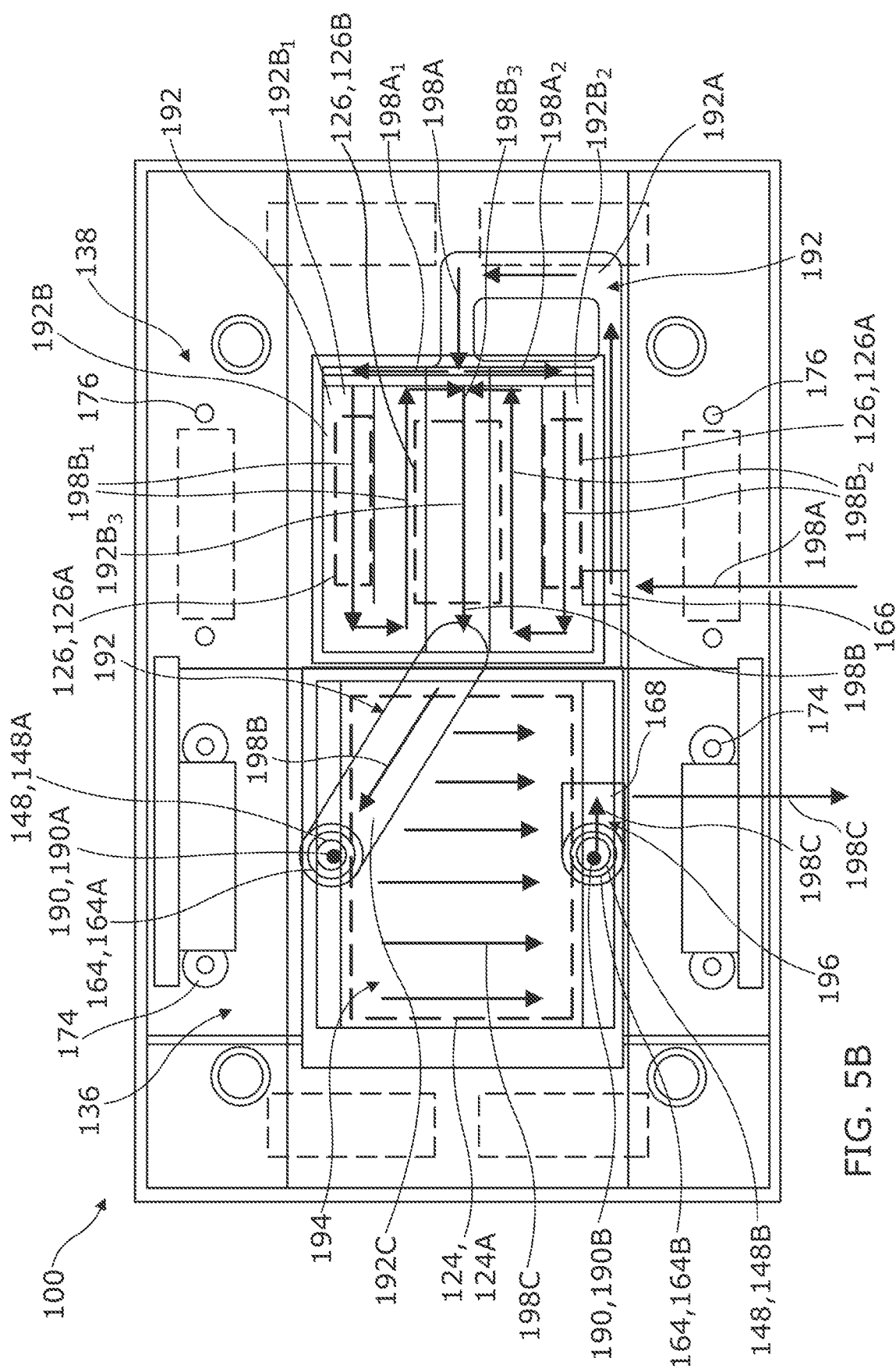
FIG. 5B illustrates a cross sectional top view of a cooling module of FIGS. 1A-1B having a first cooling component and a second cooling component according to an example implementation of the present disclosure.
Figure 6:
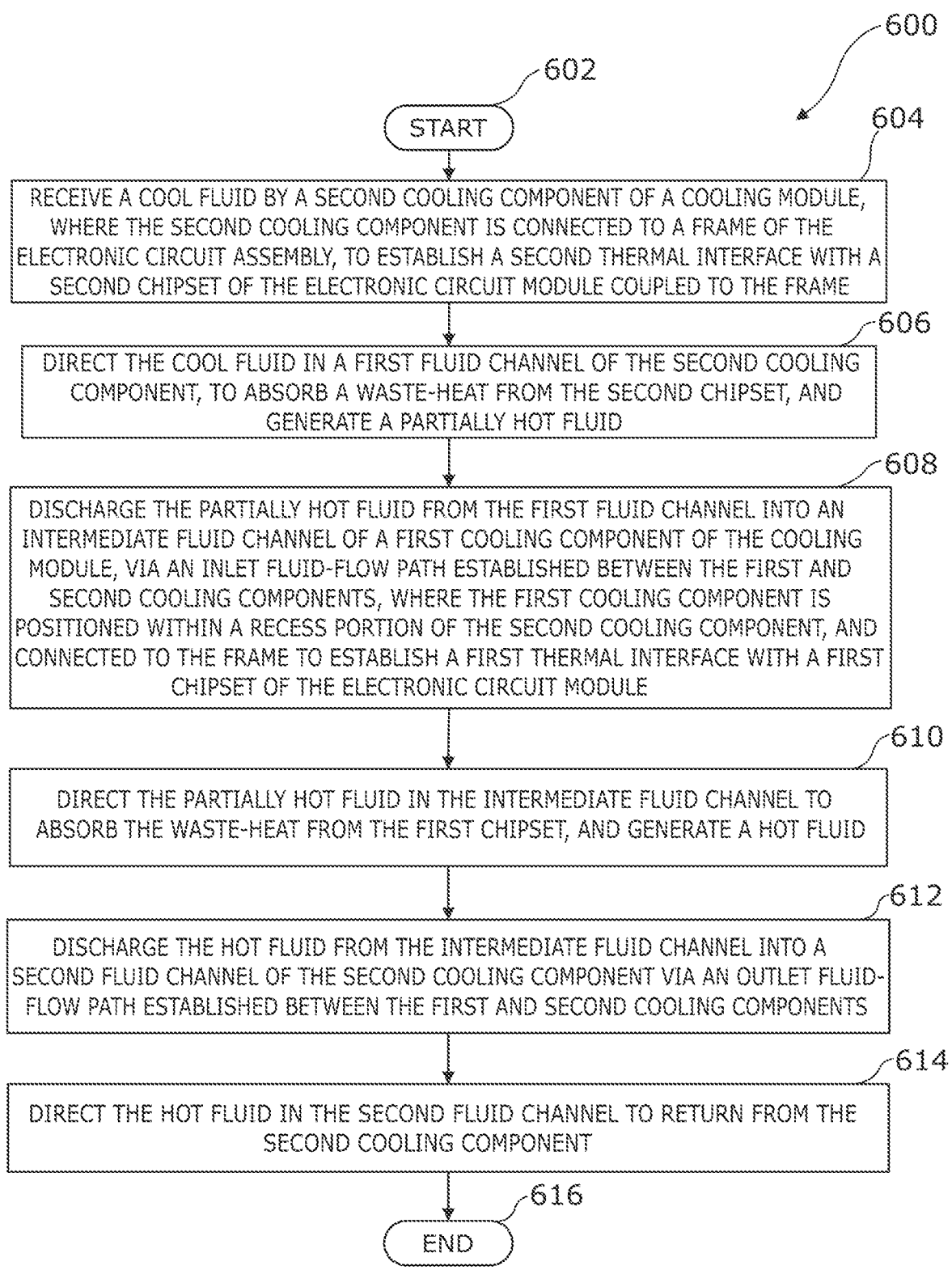
FIG. 6 illustrates a flowchart depicting a method of drawing heat away from an electronic circuit module by a cooling module according to an example implementation of the present disclosure.

Referring to FIGS. 1A-1B, the cooling module 106 functions as a fluid cooling module of the circuit assembly 100, which entails use of a cool fluid 198A (or fluid, as shown in FIGS. 5A-5B) to take away the waste-heat from the electronic chips 125 of the electronic circuit module 104 and generate a hot fluid 198C (as shown in FIGS. 5A-5B). Examples of the cool fluid 198A include, but are not limited to a cool liquid-coolant, a cool gaseous-coolant, or combinations thereof. For example, the cool liquid-coolant may have about 25 percent of propylene glycol and 75 percent of water. In some examples, the temperature of the cool fluid 198A may be about 36 degrees, which is known as a supply temperature or a secondary temperature, the temperature of the hot fluid 198C may be about 60 degrees, which is known as a return temperature or a tertiary temperature, and the temperature of a facility fluid (not shown) may be about 32 degrees, which is known as a facility temperature or a primary temperature. As used herein, the term "supply temperature" may refer to the temperature of the cool fluid 198A delivered from a coolant distribution unit (CDU, not shown) to the cooling module 106 of each circuit assembly 100. Similarly, the term "return temperature" may refer to the temperature of the hot fluid 198C discharged from the cooling module 106 of each circuit assembly 100 to the CDU. Further, the term "facility temperature" may refer to the temperature of the facility fluid directed from a data-center environment to the CDU for cooling the hot fluid 198C received from the cooling module 106. In one or more examples, the CDU may include at least one heat exchanger system to enable transfer of the waste-heat from the hot fluid 198C to the facility fluid in order to regenerate the cool fluid 198A. In one or more examples, the supply temperature of the cool fluid 198A may be a combination of the facility temperature of the facility fluid, and an approach temperature of the heat exchanger in the CDU. In some examples, the approach temperature may be a rise in temperature of the cool fluid 198A or a difference in temperature between the cool fluid 198A and the facility fluid.

In some examples, the cooling module 106 includes a first cooling component 136 and a second cooling component 138. In some examples, each of the first and second cooling components 136, 138 respectively, is a thermally conductive component, for example, a cold plate. In such examples, each of the first and second cooling components 136, 138 respectively, has internal channels or fluid channels, such as micro-channels (not shown in FIGS. 1A-1B) for guiding (or directing) the cool fluid 198A to absorb the waste-heat, and generate a hot fluid 198C.

Figure 2D:
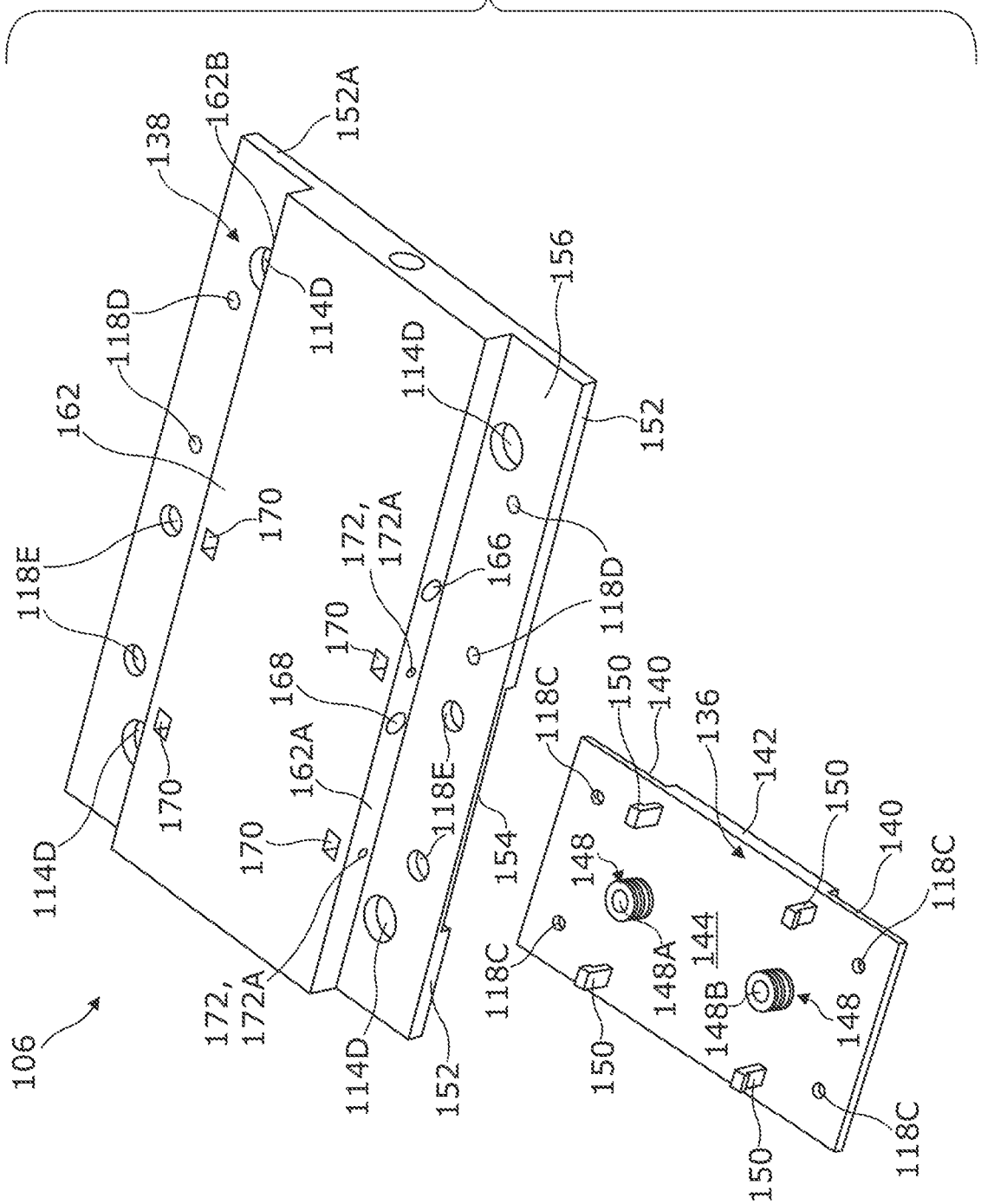
FIG. 2D illustrates an exploded perspective top view of a cooling module of the circuit assembly of FIGS. 1A-1B according to an example implementation of the present disclosure.
Figure 2E:
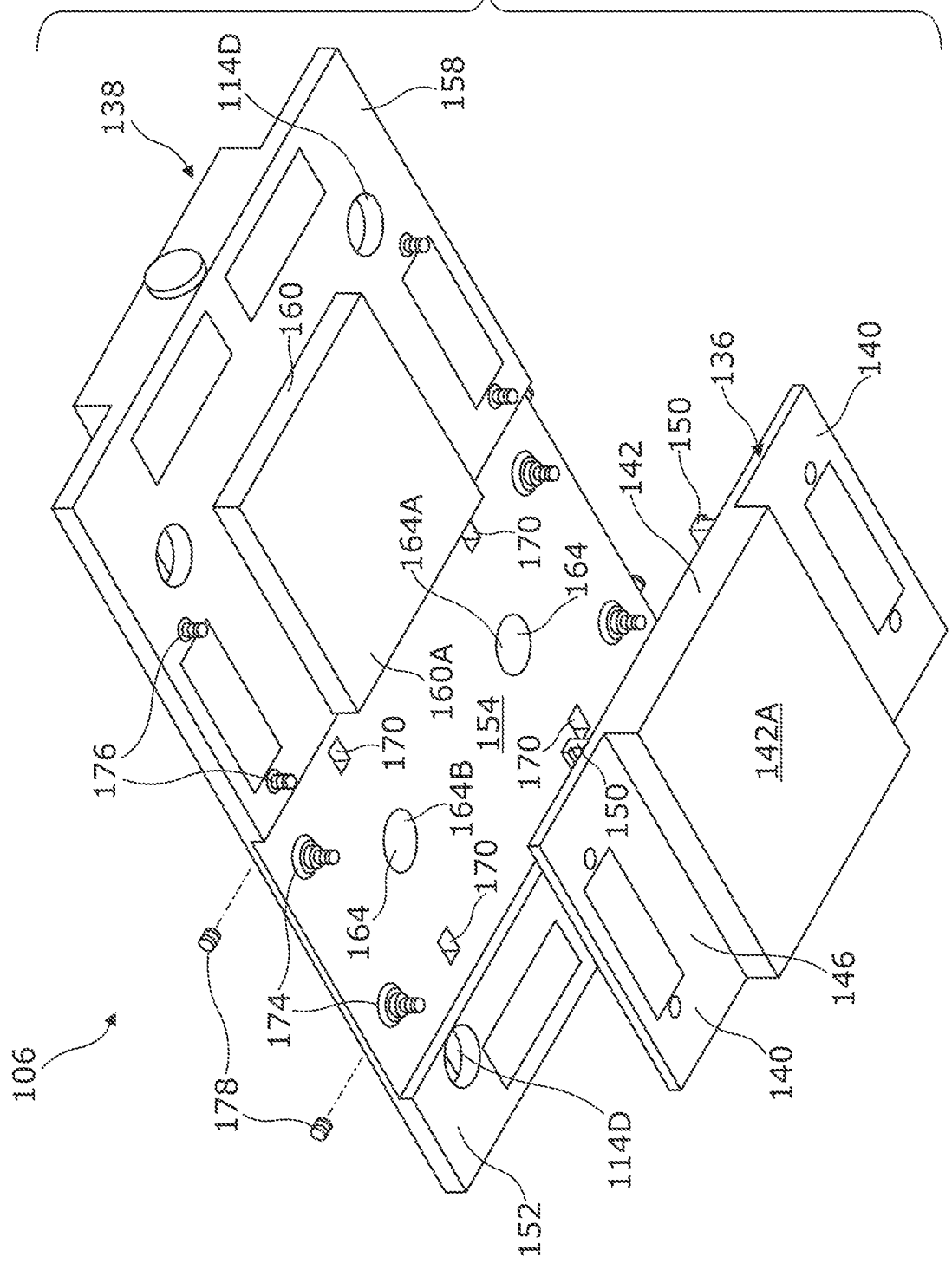
FIG. 2E illustrates an exploded perspective bottom view of a cooling module of the circuit assembly of FIGS. 1A-1B according to an example implementation of the present disclosure.

FIG. 2D depicts an exploded top view of the cooling module 106, and FIG. 2E depicts an exploded bottom view of the cooling module 106. In one or more examples, the first cooling component 136 includes a pair of first flange portions 140, a first cooling portion 142 located between the pair of first flange portions 140, and a pair of first fluid connectors 148. In some examples, the first cooling component 136 has a top surface 144 and a bottom surface 146. In such examples, the first cooling portion 142 is formed at the bottom surface 146. For example, the first cooling portion 142 protrudes outwards from the bottom surface 146 of the first cooling component 136. In one or more examples, a bottom surface of the first cooling portion 142 functions as a first thermal interfacing surface 142A of the cooling module 106. In some examples, the first cooling portion 142 has a height that is substantially greater than a height of each flange of the pair of first flange portions 140. Further, each flange of the pair of first flange portions 140 has equal height.

In some examples, the pair of first fluid connectors 148 is formed at the top surface 144 of the first cooling component 136. For example, the pair of first fluid connectors 148 protrudes outwards from the top surface 144. The pair of first fluid connectors 148 includes a first connector 148A of the pair of first fluid connectors 148, and a second connector 148B of the pair of first fluid connectors 148. In one or more examples, the pair of first fluid connectors 148 is fluidically connected to an intermediate fluid channel 194 (see, FIGS. 5A-5B) formed within the first cooling portion 142 of the first cooling component 136. For example, the first connector 148A may be connected to one end portion 184 (as shown in FIG. 1C) of the intermediate fluid channel 194, and the second connector 148B may be connected to another end (not shown) of the intermediate fluid channel 194. In some examples, the pair of first fluid connectors 148 may be one of a fluid piston or a fluid bore. In the examples of FIGS. 2D-2E, each connector of the pair of first fluid connectors 148 is the fluid piston. It may be noted herein that the fluid piston is discussed in greater details in the examples of FIGS. 1C-1D.

The first cooling component 136 further includes a plurality of third holes 118C. For example, each flange of the pair of first flange portions 140 may include a pair of third holes among the plurality of third holes 118C. In one or more examples, each third hole of the plurality of third holes 118C is aligned with a respective first hole of the plurality of first holes 118A formed in the cover portion 102B of the frame 102. The first cooling component 136 further includes a plurality of retention tabs 150 spaced apart from each other and formed on the top surface 144 of the first cooling component 136. For example, each retention tab of the plurality of retention tabs 150 extends outwards from the top surface 144 of the first cooling component 136.

In one or more examples, the second cooling component 138 includes a pair of second flange portions 152, a recess portion 154 located between the pair of second flange portions 152, and a pair of second fluid connectors 164. In some examples, the second cooling component 138 has a top surface 156 and a bottom surface 158. The second cooling component 138 further includes a second cooling portion 160 and a third cooling portion 162. In some examples, the second cooling portion 160 is formed at the bottom surface 158 corresponding to a portion of a first flange 152A of the pair of second flange portions 152. In such examples, the second cooling portion 160 protrudes outwards from the bottom surface 158 of the second cooling component 138. In one or more examples, a bottom surface of the second cooling portion 160 functions as a second thermal interfacing surface 160A of the cooling module 106. In some examples, the second cooling portion 160 has a height that is substantially greater than a height of each flange of the pair of second flange portions 152. Further, each flange of the pair of second flange portions 152 has equal height. The third cooling portion 162 is formed on the top surface 156 of the second cooling component 138. For example, the third cooling portion 162 protrudes outwards from the top surface 156 and extends between the pair of second flange portions 152 and the recess portion 154. In some examples, the third cooling portion 162 has a height that is substantially greater than the height of each flange of the pair of second flange portions 152. The second cooling component 138 further includes a fluid inlet 166 and a fluid outlet 168 spaced apart from each other and formed in a first peripheral wall 162A of the third cooling portion 162.

In one or more examples, the pair of second fluid connectors 164 is formed at the bottom surface 158. For example, the pair of second fluid connectors 164 is located at the recess portion 154, where each connector of the pair of second fluid connectors 164 protrudes inwards towards the third cooling portion 162 from the recess portion 154. In some examples, the pair of second fluid connectors 164 includes another first connector 164A, and another second connector 164B. In one or more examples, the other first connector 164A may be fluidically connected to the fluid inlet 166 via a first fluid channel 192 (as shown in FIGS. 5A-5B) formed within the second cooling portion 160 and the third cooling portion 162 of the second cooling component 138. Similarly, the other second connector 164B may be fluidically connected to the fluid outlet 168 via a second fluid channel 196 (as shown in FIGS. 5A-5B) formed within the third cooling portion 162 of the second cooling component 138. In one or more examples, the other first connector 164A of the second cooling component 138 is aligned with the first connector 148A of the first cooling component 136. Similarly, the other second connector 164B of the second cooling component 138 is aligned with the second connector 148B of the first cooling component 136. In some examples, the pair of second fluid connectors 164 may be the other one of the fluid piston or the fluid bore. In the examples of FIGS. 2D-2E, each connector of the pair of second fluid connectors 164 is the fluid bore. It is noted that the fluid bore is discussed in greater detail in the examples of FIGS. 1C-1D.

The second cooling component 138 further includes a plurality of fourth holes 118D formed in the first flange 152A of the pair of second flange portions 152. In one or more examples, each fourth hole of the plurality of fourth holes 118D is aligned with a respective second hole of the plurality of second holes 118B formed in the cover portion 102*b* of the frame 102. Further, each fourth hole of the plurality of fourth holes 118D has a diameter that is substantially equal to the diameter of each second hole of the plurality of second holes 118B.

In some examples, the second cooling component 138 further includes a plurality of fifth holes 118E formed in the recess portion 154. In one or more examples, each fifth hole of the pair of fifth holes 118E is aligned to a respective third hole of the plurality of third holes 118C formed in the first cooling component 136. Further, each fifth hole of the plurality of fifth holes 118E has a diameter that is substantially greater than i) the diameter of the each third hole of the plurality of third holes 118C formed in the first cooling component 136 and ii) the diameter of each first hole of the plurality of first holes 118A formed in the cover portion 102B of the frame 102. Similarly, each third hole of the plurality of third holes 118C has a diameter that is substantially equal to the diameter of each first hole of the plurality of first holes 118A. Additionally, the second cooling component 138 includes a plurality of fourth clamping holes 114D. Each hole of the plurality of fourth clamping holes 114D is aligned to a respective hole of the plurality of second clamping holes 114*b* formed in the cover portion 102B of the frame 102. Further, each hole of the plurality of fourth clamping holes 114D has a diameter that is substantially greater than a diameter of each respective hole of the plurality of first, second, and third clamping holes 114A, 114B, 114C. Further, each hole of the plurality of first, second, and third clamping holes 114A, 114B, 114C respectively, have equal diameter.

The second cooling component 138 additionally includes a plurality of retention holes 170 (or a plurality of retention bores) spaced apart from each other, and formed on the third cooling portion 162 of the second cooling component 138. For example, each retention hole of the plurality of retention holes 170 is located in the recess portion 154 and extends along the third cooling portion 162. Each retention hole of the plurality of retention holes 170 is aligned to a respective retention tab of the plurality of retention tabs 150 formed in the first cooling component 136. In some examples, each retention hole of the plurality of retention holes 170 has a diameter, which is substantially equal to a diameter/width of a respective retention tab of the plurality of retention tabs 150.

The second cooling component 138 further includes a plurality of captive fastener holes 172 (or a plurality of captive fastener bores) formed in peripheral walls of the third cooling portion 162. For example, one pair of captive fastener holes 172A is formed in the first peripheral wall 162A of the third cooling portion 162 and another pair of captive fastener holes (not shown) is formed in a second peripheral wall 162B of the third cooling portion 162. In some examples, each captive hole of the plurality of captive fastener holes 172 may extend up to a respective retention hole of the plurality of retention holes 170. Even though not illustrated in the examples of FIGS. 1A-1B, it may be noted herein, that each captive fastener hole 172 is a stepped hole (or bore). In one or more examples, each captive fastener 178 (as shown in FIG. 2E) may be retained freely inside the captive fastener hole (stepped hole) without getting the respective captive fastener 178 lost from the second cooling component 138, and at the same time the stepped hole may allow the respective captive fastener 178 to be selectively fastened to engage (or disengage) with the respective retention tab 150 to couple (or decouple) the first and second cooling components 136, 138 respectively, to each other.

Referring to FIGS. 1A-1B, the example cooling module 106 further includes a plurality of first spring loaded fasteners 174 and a plurality of second spring loaded fasteners 176. In one or more examples, each fastener of the plurality of first spring loaded fasteners 174 may be inserted through respective holes of the plurality of third and first holes 118C, 118A respectively, to connect the first cooling component 136 to the frame 102. Similarly, each fastener of the plurality of second spring loaded fasteners 176 may be inserted through respective holes of the plurality of fourth and second holes 118D, 118B respectively, to connect the second cooling component 138 to the frame 102. Referring to the Figure, FIG. 2F depicts one spring loaded fastener among the plurality of first spring loaded fasteners 174, for example. It may be noted herein that the first and second spring loaded fasteners 174, 176 are substantially similar. Referring to the Figure, FIG. 2F in particular, the first spring loaded fastener 174 includes a shoulder screw 174A and a spring 174B. The shoulder screw 174A includes a head portion $174A_1$, a shank portion $174A_2$, and a thread portion $174A_3$. In such examples, the head portion $174A_1$ has a diameter greater than a diameter of the shank portion $174A_2$ and the thread portion $174A_3$. Further, the shank portion $174A_2$ has a diameter that is greater than a diameter of the thread portion $174A_3$. The spring 174B is a helical compression spring mounted to the shank portion $174A_2$. In one or more examples, the thread portion $174A_3$ of the first spring loaded fastener 174 may be fastened into the first hole 118A of the cover portion 102b of the frame 102, in order to connect the first cooling component 136 to the frame 102. In such examples, the spring 174B may get compressed by such fastening of the thread portion $174A_3$ into the first hole 118A, thereby causing the spring 174B to bias the first cooling component 136 to move towards the first electronic chipset 124 to establish a thermal interface with the first electronic chipset 124.

Accordingly, in one or more examples, each spring 174B in the plurality of first spring loaded fasteners 174 may individually bias the first cooling component 136 to move towards the first electronic chipset 124 to establish a first thermal interface with the first electronic chipset 124. Similarly, each spring in the plurality of second spring loaded fasteners 176 may individually bias the second cooling component 138 to move towards the second electronic chipset 126 to establish a second thermal interface with the second electronic chipset 126.

Figure 2G:
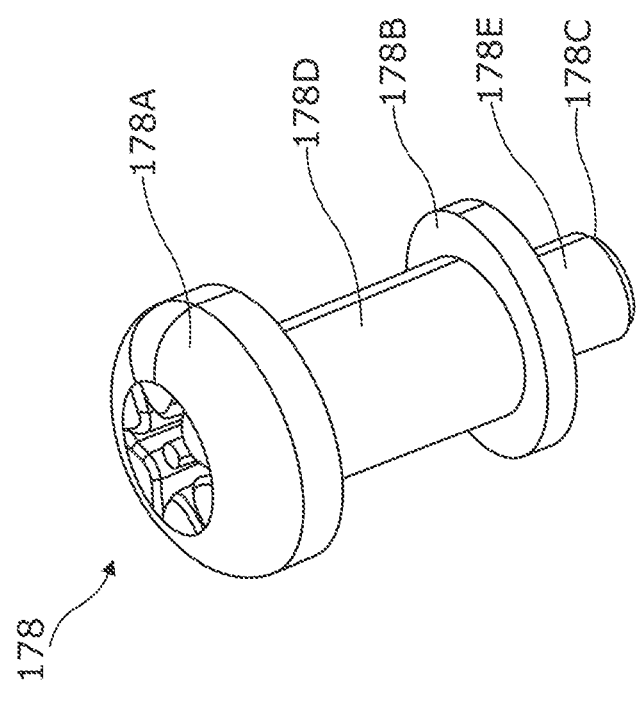
FIG. 2G illustrates a perspective view of a captive fastener of the cooling module in the circuit assembly of FIGS. 1A-1B according to an example implementation of the present disclosure.
Figure 2F:
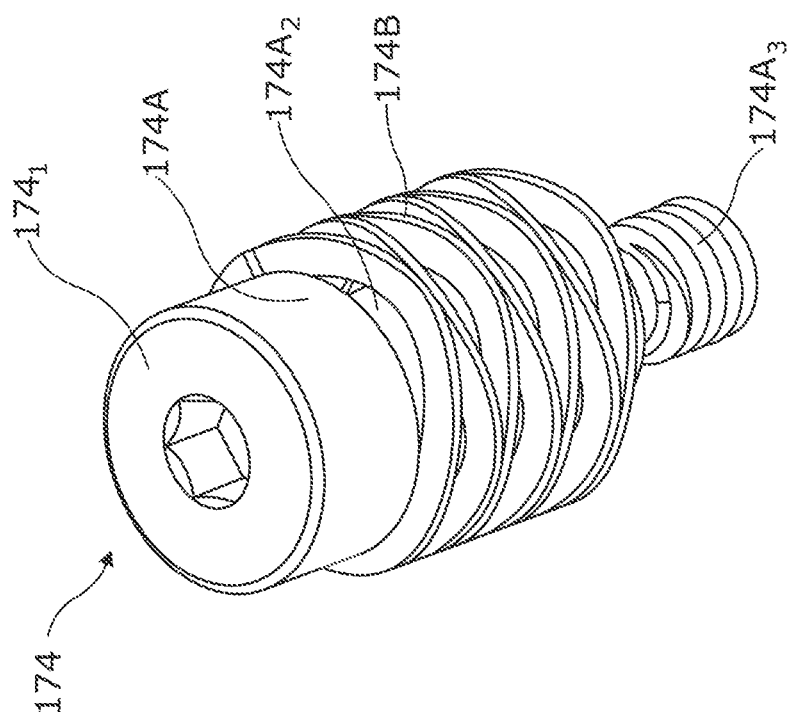
FIG. 2F illustrates a perspective view of a spring loaded fastener of a cooling module in the circuit assembly of FIGS. 1A-1B according to an example implementation of the present disclosure.

Referring to FIGS. 1A, 2E, and 2G, the cooling module 106 further includes a plurality of captive fasteners 178. In some examples, each captive fastener 178 is a special type of screw that may remain freely inside an opening of an object, for example, the captive fastener hole 172 without getting lost from the captive fastener hole 172, and at the same time the captive fastener 178 may be selectively fastened to lock the second cooling component 138 to the first cooling component 136. In some examples, the captive fastener 178 includes a head portion 178A, an intermediary portion 178B, an end portion 178C, a first body portion 178D connecting the head and intermediary portions 178A, 178B, and a second body portion 178E connecting the intermediary portion 178B and the end portion 178C. The head and intermediary portions 178A, 178B has substantially equal diameter. The first and second body portions 178D, 178E has substantially equal diameter. The intermediary portion 178B may have a diameter greater than the diameter of the captive fastener hole 172, thereby freely retaining the captive fastener 178 within the captive fastener hole 172. The second body portion 178E may have threads to move relative to counter threads formed in the captive fastener hole 172. Further, the end portion 178C of the captive fastener 178 may get engaged with the retention tab 150 of the first cooling component 136 (see, FIG. 3) in order to couple the first and second cooling components 136, 138 to one another.

Although the circuit assembly 100 of FIGS. 1A-1B is shown to include one cooling module 106, use of more than one cooling module in the circuit assembly 100 is also contemplated within the scope of the present disclosure. The cooling module 106 presented herein is a fluid cooling module that entails use of the cool fluid 198A to take away the waste-heat from the electronic chips 125 and generate the hot fluid 198B. For ease of illustration, other components and devices of a thermal management system (e.g., CDU, manifolds, flowlines, coolant circulation pumps, valves, etc.) used to enable a flow of the cool fluid 198A from the CDU to the cooling module 106, and the flow of the hot fluid 198B to the CDU are not shown in FIGS. 1A-1B, and are considered to be out of the scope of the present disclosure.

Referring to FIGS. 1A-1B and FIGS. 2A-2C, during assembly of the cooling module 106, the electronic circuit module 104 is disposed on the base portion 102A of the frame 102 such that the circuit board 128 is seated on the floor section 112A of the base portion 102A, and each hole of the plurality of third clamping holes 114C is aligned to the respective hole of the plurality of first clamping holes 114A in the base portion 102A. Further, the cover portion 102B of the frame 102 is mounted in the base portion 102A such that the first electronic chipset 124 and the second electronic chipset 126 are accessible from the opening 110 in the cover portion 102B. Further, each second hole of the plurality of second clamping holes 114B in the cover portion 102B is aligned to the respective hole of the plurality of third clamping holes 114C in the circuit board 128. Later, a clamping fastener of a plurality of clamping fasteners (not shown) is inserted into respective clamping holes of the plurality of second, third, and first clamping holes 114B, 114C, 114A respectively, in the cover portion 102B, the circuit board 128, and the base portion 102A respectively, so as to couple the cover portion 102B to the base portion 102A and form the frame 102 having the electronic circuit module 104 sandwiched therebetween.

As discussed in the example of FIG. 2C, the electronic chips 125 (e.g., the first electronic chipset 124 and the second electronic chipset 126) may have at least one of the varied height ("$H_1$", "$H_2$") or flatness ("$F_1$", "$F_2$") resulting in an uneven topology of respective top surfaces 130, 134. For example, in some implementations, the first electronic chipset 124 and the second electronic chipset 126 disposed on the circuit board 128 may have different heights "$H_1$" and "$H_2$" respectively, as shown in FIG. 2C. Accordingly, the top surfaces 130, 134 of the first and second electronic chipsets 124, 126 respectively may be positioned at different heights. Similarly, the first and second electronic chipsets 124, 126 respectively, may have different flatnesses "$F_1$" and "$F_2$" respectively, due to design tolerances, or the like, as shown in FIG. 2C. In certain other implementations, even though the first and second electronic chipsets 124, 126 disposed on the circuit board 128 may have the same height, the top surfaces 130, 134 of the first and second electronic chipsets 124, 126 may be positioned at different heights due to one or more of soldering imperfections, or variations in applied pressures on the first and second electronic chipsets 124, 126.

In accordance with the aspects of the present disclosure, the cooling module 106 facilitates to accommodate such variations in at least one of the flatness or the height between the first and second electronic chipsets 124, 126, as discussed herein below. Thus, referring to the Figures, FIGS. 1A-1B and 2D-2E, the first cooling component 136 is mounted on the frame 102 such that the first cooling portion 142 of the first cooling component 136 faces the first electronic chipset 124 of the circuit board 128. In some examples, upon mounting of the first cooling component 136 on the frame 102, the first thermal interfacing surface 142A of the first cooling component 136 may align with the first thermal interfacing surface 130A of the first electronic chipset 124. As discussed, in the example of FIG. 2C, since the first thermal interfacing surface 130A of the first electronic chipset 124 has uneven flatness "$F_1$", the first thermal interfacing surface 142A of the first cooling component 136 may align to it, thereby resulting in the top surface 144 of the first cooling component 136 to be tilted. Later, each fastener of the plurality of first spring loaded fasteners 174 is inserted into the respective third hole 118C in the first cooling component 136 and to the respective first hole 118A in the cover portion 102B to connect the first cooling component 136 on the frame 102. In some examples, each spring of the plurality of first spring loaded fasteners 174 may bias the first cooling component 136 to move towards the first electronic chipset 124, thereby establishing a first thermal interface between the first thermal interfacing surfaces 142A, 130A of the first cooling component 136 and the first electronic chipset 124.

Further, the second cooling component 138 is positioned over the first cooling component 136 such that the plurality of retention holes 170 in the second cooling component 138 is aligned with the plurality of retention tabs 150 of the first cooling component 136. Later, the second cooling component 138 is mounted on the frame 102 with the second cooling portion 160 of the second cooling component 138 facing the second electronic chipset 126 of the circuit board 128. In such examples, when the second cooling component 138 is mounted on the frame 102, the first cooling component 136 is positioned within the recess portion 154 of the second cooling component 138, and each retention tab of the plurality of retention tabs 150 protrudes along a respective hole of the plurality of retention holes 170.

Further, upon mounting of the second cooling component 138 on the frame 102, as discussed herein, each connector of the pair of first fluid connectors 148 in the first cooling component 136 is movably connected to a respective connector of the pair of second fluid connectors 164 in the second cooling component 138 to establish a fluid-flow path 190 (see, FIG. 1C) between the first and second cooling components 136, 138. For example, the first connector 148A of the pair of first fluid connectors 148 is movably connected to the other first connector 164A of the pair of second fluid connectors 164 to establish an inlet fluid-flow path 190A (see, FIGS. 5A-5B) between the first and second cooling components 136, 138. Similarly, the second connector 148B of the pair of first fluid connectors 148 is movably connected to the other second connector 164B of the pair of second fluid connectors 164 to establish an outlet fluid-flow path 190B (see, FIGS. 5A-5B) between the first and second cooling components 136, 138.

In some examples, mounting of the second cooling component 138 on the frame 102 causes the second cooling component 138 to move up (and down) relative to the first cooling component 136 to accommodate the variation in the height ("$H_1$" "$H_2$") between the first and second electronic chipsets 124, 126. Further, mounting of the second cooling component 138 to the frame 102 may additionally cause the second cooling component 138 to tilt relative to the first cooling component 136 to align with the top surface 144 of the first cooling component 136 so as to accommodate the variation in the flatness ("$F_1$", "$F_2$") between the first and second electronic chipsets 124, 126. In some examples, mounting of the second cooling component 138 on the frame 102 may cause both a tilting movement and an up and down movement of the second cooling component 138 relative to the first cooling component 136 to accommodate the variation in the flatness and the height respectively, between the first and second electronic chipsets 124, 126. In such examples, each retention tab of the plurality of retention tabs 150 may slide along the respective retention hole of the plurality of retention holes 170 so as to align the second cooling component 138 with the first cooling component 136.

Referring to FIGS. 1C-1D, in some examples, the first connector 148A of the pair of first fluid connectors 148 is a fluid piston $148A_1$. In such examples, the fluid piston $148A_1$ has a first diameter "$D_1$", and an outer circumferential groove 180 formed on a portion of the fluid piston $148A_1$ has a groove diameter "$D_2$". In some examples, the first diameter "$D_1$" is about 0.483 inches to about 0.538 inches. Similarly, the groove diameter "$D_2$" is about 0.376 inches to about 0.378 inches. In some other examples, the first connector 148A of the pair of first fluid connectors 148 may be a fluid bore. The cooling module 106 further includes an O-ring seal 182 disposed in the outer circumferential groove 180 of the fluid piston 148A$_1$. In some examples, an inner diameter of the O-ring seal 182 may be around 0.359 inches to about 0.367 inches. In some examples, the fluid piston 148A$_1$ is connected to one end portion 184 of the intermediate fluid channel 194 (as shown in FIGS. 5A-5B) of the first cooling component 136.

In some examples, the other first connector 164A of the pair of second fluid connectors 164 is a fluid bore 164A$_1$. In such examples, the fluid bore 164A$_1$ has a wall 186 (or circumferential wall) and a second diameter "D$_3$". In some examples, the second diameter "D$_3$" is greater than the first diameter "D$_1$". In some examples, the second diameter "D$_3$" is about 0.486 inches to about 0.544 inches. The fluid bore 164A$_1$ is connected to one end 188 of the first fluid channel 192 (as shown in FIGS. 5A-5B) of the second cooling component 138. In some other examples, the other first connector 164A of the pair of second fluid connectors 164 may be a fluid piston.

In one or more examples, the first connector 148A of the pair of first fluid connectors 148 is movably connected to the other first connector 164A of the pair of second fluid connectors 164 to establish a fluid-flow path 190 between the first and second cooling components 136, 138. In other words, the fluid bore 164A$_1$ is movably connected to the fluid piston 148A$_1$ to establish the fluid-flow path 190 therebetween. For example, the fluid piston 148A$_1$ is inserted inside the wall 186 of the fluid bore 164A$_1$ such that the O-ring seal 182 is compressed against the wall 186. In such examples, the fluid piston 148A$_1$ and the fluid bore 164A$_1$ are maintained at a uniform extrusion gap "G$_1$" circumferentially along the second diameter "D$_3$" of the fluid bore 164A$_1$. In some examples, the extrusion gap "G$_1$" may be around 0.002 inches to about 0.008 inches.

In some examples, the O-ring seal 182 is compressed against the wall 186 of the fluid bore 164A$_1$, upon movably connecting the fluid piston 148A$_1$ to the fluid bore 164A$_1$, to prevent leakage of a fluid (as shown in FIGS. 5A, 5B) from the fluid-flow path 190. In some examples, the O-ring seal 182 may be compressed in a range of about 10 percent to 30 percent to maintain the sufficient contact with the wall 186 of the fluid bore 164A$_1$. As discussed herein, the O-ring seal 182 slides along the wall 186 of the fluid bore 164A$_1$ by an up and down movement of the second cooling component 138 relative to the first cooling component 136. In other words, the wall 186 slides downwards or upwards, while the O-ring seal 182 maintains the contact with the wall 186, to accommodate the variation in height ("H$_1$", "H$_2$") between the first and second electronic chipsets 124, 126. Thus, the O-ring seal 182 may permit the second cooling component 138 to independently move relative to the first cooling component 136 to accommodate any variation in height ("H$_1$", "H$_2$") between the first and second electronic chipsets 124, 126. In some examples, the variations in height ("H$_1$", "H$_2$") may be around 0.0052 inches to about 0.0058 inches.

Referring to FIG. 1D, the O-ring seal 182 may be eccentrically compressed against the wall 186 of the fluid bore 164A$_1$ by a tilting movement of the second cooling component 138 relative to the first cooling component 136. In some examples, the O-ring seal 182 may be eccentrically compressed to about 0.15 inches to about 2.5 inches. In such examples, the fluid piston 148A$_1$ and the fluid bore 164A$_1$ are maintained at a varied extrusion gap "G$_2$" circumferentially along the second diameter "D$_3$" of the fluid bore 164A$_1$. Thus, the O-ring seal 182 may permit the second cooling component 138 to independently tilt relative to the first cooling component 136 to accommodate a variation in flatness ("F$_1$", "F$_2$") between the first and second electronic chipsets 124, 126. In some examples, the variations in height ("F$_1$", "F$_2$") may be around 1.975 degrees to about 8.746 degrees. Accordingly, referring to FIGS. 1C-1D, the O-ring seal 182 may permit a 3-dimensional movement of the second cooling component 138 relative to the first cooling component 136 in order to accommodate the variations in at least one of the height ("H$_1$", "H$_2$") or the flatness ("F$_1$", "F$_2$") between the first and second electronic chipsets 124, 126.

In some examples, upon mounting of the second cooling component 138 on the frame 102, the second thermal interfacing surface 160A of the second cooling component 138 may align with the second thermal interfacing surface 134A of the second electronic chipset 126. Further, each fastener of the plurality of second spring loaded fasteners 176 is inserted into the respective fourth hole 118D in the second cooling component 138 and the respective second hole 118B in the cover portion 102B to connect the second cooling component 138 to the frame 102. In some examples, each spring of the plurality of second spring loaded fasteners 176 bias the second cooling component 138 to move towards the second electronic chipset 126, thereby establishing a second thermal interface between the second thermal interfacing surfaces 160A, 134A of the second cooling component 138 and the second electronic chipset 126. In some examples, each of the plurality of first spring loaded fasteners 174 may be accessed (i.e., for unfastening, for example) via the respective hole of the plurality of fifth holes 118E in the second cooling component 138. Similarly, each fastener of the plurality of clamping fasteners may be accessed (i.e., for unfastening, for example) via the respective hole of the plurality of fourth clamping holes 114D in the second cooling component 138. Referring to FIGS. 1C-1D, in one or more examples, the O-ring seal 182 slides along the wall 186 of the fluid bore 164A$_1$ by the up and down movement of the second cooling component 138 relative to the first cooling component 136, eccentrically compresses against the wall 186 of the fluid bore 164A$_1$, by the tilting movement of the second cooling component 138 relative to the first cooling component 136, or a combination thereof.

Figure 3:
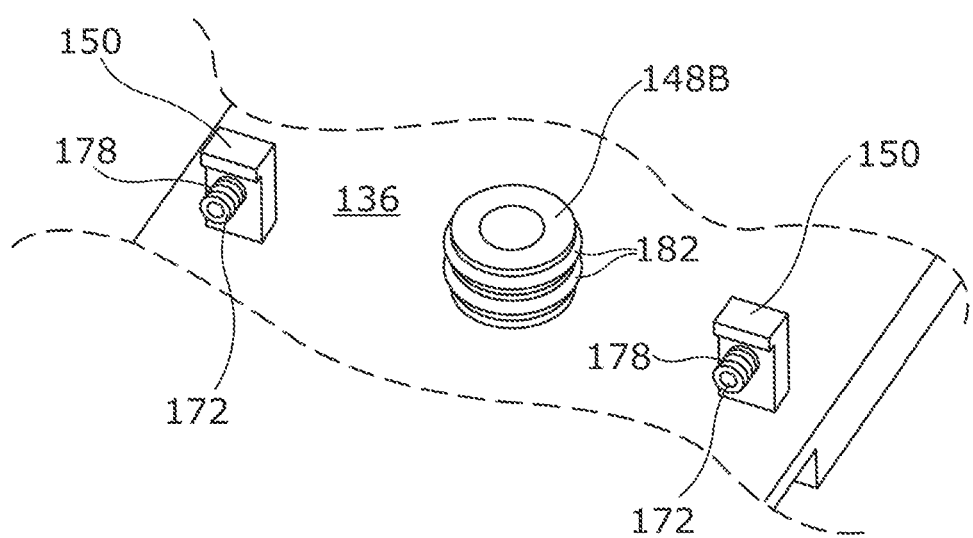
FIG. 3 illustrates a perspective view of a portion of a first cooling component and a captive fastener of FIGS. 1A-1B and FIG. 2G according to an example implementation of the present disclosure.
Figure 4:
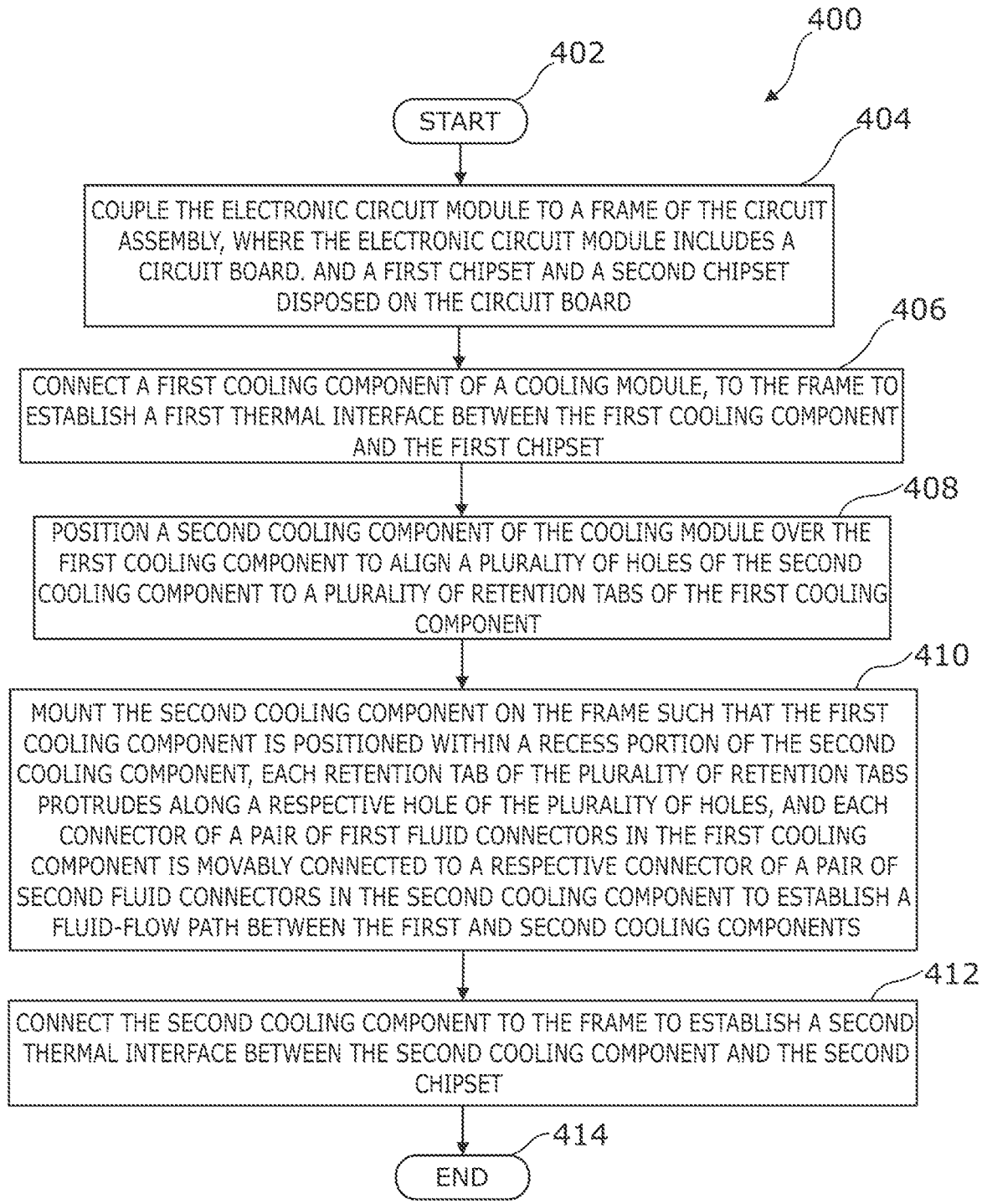
FIG. 4 illustrates a flowchart depicting a method of assembling a cooling module according to an example implementation of the present disclosure

FIG. 3 depicts a perspective view of a portion of a first cooling component 136 and a pair of captive fasteners 178 of FIGS. 1A-1B. It may be noted herein that FIG. 3 does not illustrates a second cooling component 138 for ease of illustration and such an illustration should not be construed as a limitation of the present disclosure. Referring to FIG. 2E, FIG. 2G, and FIG. 3, each captive fastener of the plurality of captive fasteners 178 is pre-disposed within a respective captive fastener hole of the plurality of captive fastener holes 172. Moreover, each captive fastener of the plurality of captive fasteners 178 is fastened in order to engage each captive fastener 178 with the respective retention tab of the plurality of retention tabs 150 so as to couple the first and second cooling components 136, 138 to one another. Thus, the captive fasteners 178 may complete the process of assembling the cooling module 106 to the electronic circuit module 104.

During operation of the circuit assembly 100, the first and second electronic chipsets 124, 126 may generate waste-heat. As will be understood, such waste-heat generated by the first and second electronic chipsets 124, 126 is unwanted and may impact operation of the electronic circuit module 104, if not managed effectively. Accordingly, in some examples, the proposed cooling module 106 may establish sufficient thermal interfaces between the cooling component and the electronic chips to enable efficient waste-heat transfer from the electronic chips irrespective of variations in at least one of the height and the flatness between the first and second electronic chipsets 124, 126. Thus, In accordance with the aspects of the present disclosure, the cooling module 106 facilitates effective cooling of the first and second electronic chipsets 124, 126 irrespective of variations in at least one of the height or flatness between the first and second electronic chipsets 124, 126.

FIG. 4 is a flowchart depicting a method 400 of assembling a cooling module to an electronic circuit module of a circuit assembly. It should be noted herein that the method 400 is described in conjunction with FIGS. 1A-1D and FIGS. 2A-2G, for example. The method 400 starts at block 402 and continues to block 404. At block 404, the method 400 includes coupling the electronic circuit module to a frame of a circuit assembly. In some examples, the electronic circuit module is disposed on a base portion of the frame. Further, a cover portion of the frame is mounted on the base portion such that the electronic circuit module is sandwiched between the base portion and the cover portion. Later, one clamping fastener of a plurality of clamping fasteners is inserted into each clamping hole of a plurality of second, third, and first clamping holes formed respectively in the cover portion of the frame, a circuit board of the electronic circuit module, and the base portion of the frame, so as to couple the electronic circuit module to the frame. In some examples, the electronic circuit module includes the circuit board, and a first electronic chipset and a second electronic chipset are disposed on the circuit board. The method 400 continues to block 406.

At block 406, the method 400 includes connecting a first cooling component of a cooling module in the circuit assembly, to the frame to establish a first thermal interface between the first cooling component and the first electronic chipset. In some examples, a plurality of first spring loaded fasteners is used to connect the first cooling component to the cover portion of the frame. The method continues to block 408.

At block 408, the method 400 includes positioning a second cooling component of the cooling module over the first cooling component to align a plurality of holes (retention holes) of the second cooling component to a plurality of retention tabs of the first cooling component. The method continues to block 410. At block 410, the method 400 includes mounting the second cooling component on the frame. In some examples, mounting includes positioning the first cooling component within a recess portion of the second cooling component. Further, mounting includes protruding each retention tab of the plurality of retention tabs along a respective hole of the plurality of retention holes. Additionally, mounting includes movably connecting each connector of a pair of first fluid connectors in the first cooling component to a respective connector of a pair of second fluid connectors in the second cooling component to establish a fluid-flow path between the first and second cooling components. In some examples, the method 400 includes performing additional sub-steps upon mounting the second cooling component on the frame. In some examples, the first sub-step may include tilting the second cooling component relative to the first cooling component to align with a surface of the first cooling component to accommodate a variation in a flatness between the first electronic chipset and the second electronic chipset. Further, the second sub-step may include moving the second cooling component up (and/or down) relative to the first cooling component, to accommodate a variation in a height between the first electronic chipset and the second electronic chipset. In some examples, mounting of the second cooling component on the frame may cause both a tilting movement and an up and down movement of the second cooling component relative to the first cooling component to accommodate the variation in the flatness and the height respectively, between the first and second electronic chipsets. In some examples, the cooling module further includes an O-ring seal connected to one connector of the pair of first fluid connectors or the pair of second fluid connectors. In such examples, the O-ring seal slides along a wall of another connector of the pair of first fluid connectors or the pair of second fluid connectors by the up and down movement of the second cooling component relative to the first cooling component, eccentrically compresses against the wall by the tilting movement of the second cooling component relative to the first cooling component, or a combination thereof. The method 400 continues to block 412.

At block 412, the method 400 includes connecting the second cooling component to the frame to establish a second thermal interface between the second cooling component and the second electronic chipset. In some examples, a plurality of second spring loaded fasteners is used to connect the second cooling component to the cover portion of the frame. The method 400 may additionally include a step of coupling the first and second cooling components to each other by way of inserting each captive fastener of a plurality of captive fasteners into a respective captive fastener hole of the plurality of captive fastener holes in the second cooling component so as to engage each captive fastener to a respective retention tab of a plurality of retention tabs of the first cooling component. The method 400 ends at block 414.

FIG. 5A depicts a cross sectional top view of the circuit assembly 100 taken along line 2-2' in FIG. 1B. In particular, FIG. 5A depicts a cross sectional top view of a second cooling component 138 in a cooling module 106. FIG. 5B depicts a cross sectional top view of the cooling module 106 of FIGS. 1A-1B having a first cooling component 136 and the second cooling component 138. In particular, FIG. 5B may depict a cross sectional top view of a first cooling portion 142 of the first cooling component 136, and a second cooling portion 160 and a third cooling portion 162 of the second cooling component 138. In the description hereinafter, FIGS. 5A-5B are described concurrently for ease of illustration.

As discussed hereinabove, the circuit assembly 100 includes a frame 102, an electronic circuit module 104, and the cooling module 106. In such examples, the cooling module 106 includes the first cooling component 136 (as shown in FIG. 5B) and the second cooling component 138. In some examples, the first cooling component 136 has a pair of first fluid connectors 148 and an intermediate fluid channel 194. The second cooling component 138 has a fluid inlet 166, a fluid outlet 168, a pair of second fluid connectors 164, a first fluid channel 192, and a second fluid channel 196.

In some examples, the first cooling component 136 is positioned within a recess portion 154 (as shown in FIG. 2D-2E) of the second cooling component 138 to fluidically couple the first and second cooling components 136, 138 to each other. In such examples, each connector of the pair of first fluid connectors 148 is movably connected to a respective connector of the pair of second fluid connectors 164 to establish a fluid-flow path 190 between the first and second cooling components 136, 138. For example, a first connector 148A of the pair of first fluid connectors 148 is movably connected to another first connector 164A of the pair of second fluid connectors 164 to establish an inlet fluid-flow path 190A between the first and second cooling components

136, 138. Similarly, a second connector 148B of the pair of first fluid connectors 148 is movably connected to another second connector 164B of the pair of second fluid connectors 164 to establish an outlet fluid-flow path 190B between the first and second cooling components 136, 138. Accordingly, the pair of first and second fluid connectors 148, 164 enable the first cooling component 136 to be fluidically connected to the second cooling component 138. In some examples, each connector of the pair of first fluid connectors 148 is one of a fluid piston or a fluid bore. Further, each connector of the pair of second fluid connectors 164 is the other one of the fluid piston or the fluid bore. In the examples of FIGS. 1C-1D and FIGS. 5A-5B, each connector of the pair of first fluid connectors 148 is the fluid piston 148$A_1$ (see, FIGS. 1C-1D) and each connector of the pair of second fluid connectors 164 is the fluid bore 164$A_1$ (see, FIGS. 1C-1D), for example. The cooling module 106 further includes an O-ring seal 182 (as shown in FIGS. 1C-1D). In such examples, the O-ring seal 182 is disposed in an outer circumferential groove 180 (as shown in FIGS. 1C-1D) of the fluid piston 148$A_1$. The O-ring seal 182 is compressed against a wall 186 of the fluid bore 164$A_1$, upon movably connecting the fluid piston 148$A_1$ to the fluid bore 164$A_1$, so as to prevent leakage of a fluid from the inlet fluid-flow path 190A and the outlet fluid-flow path 190B. Further, as discussed hereinabove, the O-ring seal 182 may slide along the wall 186 of the fluid bore 164$A_1$ (or the wall 186 may slide along the O-ring seal 182), by an up and down movement of the second cooling component 138 relative to the first cooling component 136 so as to accommodate the variation in height between a first electronic chipset 124 and a second electronic chipset 126. Similarly, the O-ring seal 182 is eccentrically compressed against the wall 186 of the fluid bore 164$A_1$ by a tilting movement of the second cooling component 138 relative to the first cooling component 136 so as to accommodate the variation in flatness between the first electronic chipset 124 and the second electronic chipset 126.

In some examples, each channel of the first fluid channel 192 and the second fluid channel 196 is formed within the second cooling component 138. In particular, the first fluid channel 192 is formed within the second and third cooling portions 160, 162 respectively (as labeled in FIGS. 2D-2E), of the second cooling component 138. The second fluid channel 196 is formed within the third cooling portion 162. Similarly, the intermediate fluid channel 194 is formed within the first cooling component 136. In particular, the intermediate fluid channel 194 is formed within the first cooling portion 142 (as labeled in FIG. 2D) of the first cooling component 136. In some examples, the first fluid channel 192 extends between the fluid inlet 166 and the first connector 148A of the pair of first fluid connectors 148. The second fluid channel 196 extends between the second connector 148B of the pair of first fluid connectors 148 and the fluid outlet 168. Further, the intermediate fluid channel 194 extends between the first connector 164A and the second connector 164B of the pair of second fluid connectors 164.

In one or more examples, the first fluid channel 192 includes a supply section 192A, a body section 192B, and a return section 192C. In some examples, the body section 192B has a tortuous or a circuitous flow route. For example, the body section 192B is bifurcated into a first body section 192$B_1$, and a second body section 192$B_2$. Further, the first body section 192$B_1$ and the second body section 192$B_2$ are merged into a third body section 192$B_3$. In some examples, the first body section 192$B_1$ and the second body section 192$B_2$ are parallel sections. In some examples, the intermediate fluid channel 194 has a single-pass flow route. In some examples, the body section 192B and the intermediate fluid channel 194 include micro-channels. In some examples, each micro-channel may have a width of about 0.15 millimeter.

Referring to FIG. 5A, the fluid inlet 166 and the fluid outlet 168 are disposed spaced apart from each other, and formed in a first peripheral wall 162A (see, FIG. 2D) of the third cooling portion 162. Further, the first fluid channel 192 is formed in the third cooling portion 162 and the second cooling portion 160. For example, the supply section 192A is formed in the third cooling portion 162, the body section 192B is formed in the second cooling portion 160, and the return section 192C is formed in the second and third cooling portions 160, 162. In such examples, a pair of connector body channels 192D connects the first and second body sections 192$B_1$, 192$B_2$ respectively to the supply section 192A. In some examples, each of the pair of connector body channels 192D is a radial channel, which extends between the third and second cooling portions 162, 160 respectively. Further, the return section 192C is an inclined section, which extends between the second and third cooling portions 160, 162 respectively. Further, the intermediate fluid channel 194 is formed in the first cooling portion 142. Similarly, the second fluid channel 196 is formed in the third cooling portion 162.

Referring to FIG. 5B, the first body section 192$B_1$, and the second body section 192$B_2$ extends over the plurality of second electronic chips 126A of a second electronic chipset 126. The third body section 192$B_3$ extends over the third electronic chip 126B of the second electronic chipset 126. The intermediate fluid channel 194 extends over the first electronic chip 124A of a first electronic chipset 124 disposed on the circuit board 128.

During operation of the circuit assembly 100, the first and second electronic chipsets 124, 126 may generate waste-heat. As will be understood, such waste-heat generated by the first and second electronic chipsets 124, 126 are unwanted and may impact operation of the electronic circuit module 104, if not managed effectively. Accordingly, in some examples, the proposed cooling module 106 may establish sufficient thermal interfaces between the cooling component and the electronic chips to enable efficient waste-heat transfer from the electronic chips irrespective of variations in at least one of the height and the flatness between the first and second electronic chipsets 124, 126. Further, in some examples, the proposed cooling module 106 may include the fluid channel having the tortuous flow route in order to increase a) velocity of the fluid within the fluid channel and b) heat transfer co-efficient between the cooling component and the fluid. Therefore, the proposed cooling module 106 may receive the fluid at a reduced volumetric flow rate, thereby allowing the CDU to accommodate the cool fluid (secondary fluid) requirement of multiple compute nodes (or multiple circuit assemblies 100) in each server system of the datacenter environment. In some examples, the volumetric flow rate may be around 0.12 gallons per minute.

Referring to FIG. 5B, the second cooling component 138 receives a cool fluid 198A via the fluid inlet 166. For example, the first fluid channel 192 of the second cooling component 138 receives the cool fluid 198A from the CDU, for example. In such examples, the supply section 192A of the first fluid channel 192 directs the cool fluid 198A to the body section 192B. In the body section 192B, the cool fluid 198A absorbs the waste-heat from the second electronic chipset 126, and generates a partially hot fluid 198B. For example, the cool fluid 198A is bifurcated into a first portion 198A$_1$ and a second portion 198A$_2$ in the body section 192B. The first portion 198A$_1$ is directed to the first body section 192B$_1$ to absorb the waste-heat from the plurality of second electronic chips 126A arranged in the first row 127A (as shown in FIG. 2B) and generate a first portion of the partially hot fluid 198B$_1$. Similarly, the second portion 198A$_2$ is directed to the second body section 192B$_2$ to absorb the waste-heat from the plurality of second electronic chips 126A arranged in the second row 127B (as shown in FIG. 2B) and generate a second portion of the partially hot fluid 198B$_2$. The first and second portions of the partially hot fluid 198B$_1$, 198B$_2$ are later mixed together to form a mixed portion of the partially hot fluid 198B$_3$ in the third body section 192B$_3$. The mixed portion of the partially hot fluid 198B$_3$ is directed in the third body section 192B$_3$ to absorb the waste-heat from the third electronic chip 126B and generate the partially hot fluid 198B. Further, the third body section 192B$_3$ directs the partially hot fluid 198B to the return section 192C. In such examples, the return section 192C discharges the partially hot fluid 198B into the intermediate fluid channel 194 of the first cooling component 136 via the inlet fluid-flow path 190A. In some examples, the intermediate fluid channel 194 directs the partially hot fluid 198B from one end portion 184 (as shown in FIG. 1C) to another end portion (not labeled) to absorb the waste-heat from the first electronic chip 124A of the first electronic chipset 124 and generate a hot fluid 198C. Further, the intermediate fluid channel 194 discharges the hot fluid 198C from the other end portion to the second fluid channel 196 of the second cooling component 138 via the outlet fluid-flow path 190B. In some examples, the second fluid channel 196 further directs the hot fluid 198C to the fluid outlet 168 so as to return the hot fluid 198C from the second cooling component 138.

As discussed herein, the first fluid channel 192 of the second cooling component 138, having the tortuous flow route may significantly increase a velocity of the fluid (e.g., the cool fluid 198A, and the partially hot fluid 198B) within the second cooling component 138 to efficiently dissipate the waste-heat from the second electronic chipset 126. Thus, the first fluid channel 192 may decrease the volumetric flow rate of the fluid (e.g., the cool fluid 198A) to be circulated in the cooling module 106 for cooling the second electronic chipset 126. For example, the body section 192B of the first fluid channel 192 having the bifurcated fluid sections (i.e., the first body section 192B$_1$, and the second body section 192B$_2$) may enable the cool fluid 198A to be directed in parallel at a relatively high velocity so as to uniformly cool the plurality of second electronic chips 126A (memory chips). In one or more examples, the bifurcation of the body section 192B into the first body section 192B$_1$, and the second body section 192B$_2$ may reduce a flow area for the flow of the fluid, thereby increasing i) the velocity of the cool fluid 198A in the bifurcated body sections 192B$_1$, 192B$_2$ and ii) the heat transfer co-efficient between the cool fluid 198A and the plurality of second electronic chips 126A. Further, the merged body section (i.e., the third body section 192B$_3$) may enable the mixed portion of the partially hot fluid 198B$_1$, 198B$_2$ to be directed at the relatively high velocity so as to effectively cool the high powered third electronic chip 126B (or GPU chip). In one or more examples, the merging of the first body section 192B$_1$, and the second body section 192B$_2$ into the merged body section 192B$_3$ may mix the flow of the first and second partially hot fluid portions 198B$_1$, 198B$_2$ into the mixed portion of the partially hot fluid 198B$_3$, thereby increasing i) the velocity of the mixed portion of the partially hot fluid 198B$_1$, 198B$_2$ and ii) the heat transfer co-efficient between the mixed portion of the partially hot fluid 198B$_1$, 198B$_2$ and the third electronic chip 126B. Further, as discussed herein, the intermediate fluid channel 194 of the first cooling component 136, having a single-pass flow route may enable the partially hot fluid 198B to be directed at a relatively low velocity so as to effectively cool the low powered first electronic chip 124A (or CPU chip). In one or more examples, the first electronic chip 124A is a low powered electronic chipset, and thus generates a substantially low waste-heat in comparison with the waste-heat generated by a high powered electronic chipset, such as the plurality of second electronic chips 126A and the third electronic chip 126B. Additionally, the first electronic chip 124A has a case temperature, which is higher than the case temperature of the plurality of second electronic chips 126A and the third electronic chip 126B. It may be noted herein that the term "case temperature" may refer to a maximum temperature that the electronic chip may attain while operating to execute the assigned task or workload. Accordingly, the first cooling component 136 may not be required to have the tortuous flow route to dissipate the waste-heat from the first electronic chip 124A, which has a low case temperature and low power consumption.

In one or more examples, the flow of the fluid (e.g., the cool fluid 198A, and the partially hot fluid 198B) in the tortuous flow route of the first fluid channel 192 may cause a relatively high pressure drop of the fluid in the second cooling component 138. Similarly, the flow of the fluid (e.g., the partially hot fluid 198B) in the single-pass flow route of the intermediate fluid channel 194 may also cause the pressure drop of the fluid in the first cooling component 136. Accordingly, the cooling module 106 having the relatively high pressure drop of the fluid may be advantageous to the CDU in order to maintain a balanced flow of the fluid across multiple circuit assemblies 100 (or compute nodes) in each electronic system (or each server system) of the datacenter environment. In some examples, the first fluid channel 192 having the tortuous flow route may enable the cooling module 106 to have the volumetric flow rate of about 0.12 gallons per minutes. Accordingly, the CDU in the datacenter environment may be enabled to accommodate the cool fluid 198A requirement of multiple server systems of the datacenter environment. In some examples, the CDU may be provisioned to supply the cool fluid 198A for multiple racks, for example, to at least four racks, where each rack may have about thirty-two server systems, and each server system may have about eight circuit assemblies, and each circuit assembly may have at least one cooling module.

In some examples, the plurality of second electronic chips 126A may have a second case temperature (e.g., a low case temperature), and the third electronic chip 126B may have a third case temperature (e.g., a high case temperature), where the third case temperature is greater than the second case temperature. In such examples, since the cool fluid 198A is first directed to the bifurcated body sections 192B$_1$, 192B$_2$, which are in thermal contact with the plurality of second electronic chips 126A having the low case temperature, the cool fluid 198A may have a sufficient thermal margin to efficiently dissipate the waste-heat from the plurality of second electronic chips 126A. As used herein, the term "thermal margin" may refer to a temperature difference between the case temperature of the electronic chip and the temperature of the fluid. Further, since the mixed portion of the partially hot fluid 198B$_1$, 198B$_2$ is directed to the merged body section 192B$_2$, which is in thermal contact with the third electronic chip 126B having the high case temperature, the mixed portion of the partially hot fluid 198B$_1$, 198B$_2$ may still have the sufficient thermal margin to efficiently dissipate the waste-heat from the third electronic chip 126B.

In some examples, the first electronic chip 124A may have a first case temperature (e.g., a highest case temperature), which is greater than the second and third case temperature of the plurality of second electronic chips 126A and the third electronic chip 126B respectively. In such examples, since the partially hot fluid 198B is directed to the intermediate fluid channel 194, which is in thermal contact with the first electronic chip 124A having the highest case temperature, the partially hot fluid 198B may still have the sufficient thermal margin to efficiently dissipate the waste-heat from the first electronic chip 124A.

FIG. 6 is a flowchart depicting a method 600 of dissipating a waste-heat from an electronic circuit module of a circuit assembly. It should be noted herein that the method 600 is described in conjunction with FIGS. 1A-1D and FIGS. 5A-5B, for example. The method 600 starts at block 602 and continues to block 604. At block 604, the method 600 includes receiving a cool fluid by a second cooling component of a cooling module via a fluid inlet in the second cooling component. In some examples, the second cooling component is connected to a frame of the electronic circuit assembly, to establish a second thermal interface with a second electronic chipset of the electronic circuit module coupled to the frame. In some examples, a plurality of second spring loaded fasteners is used to connect the second cooling component to the frame. The method 600 continues to block 606.

At block 606, the method 600 includes directing the cool fluid in a first fluid channel of the second cooling component, to absorb a waste-heat from the second electronic chipset, and generate a partially hot fluid. In one or more examples, the first fluid channel includes a supply section, a body section, and a return section. The body section is bifurcated into a first body section, and a second body section. Further, the first body section and the second body section are merged into a third body section. In some examples, the first body section and the second body section are parallel sections. In some examples, directing the cool fluid in the first fluid channel includes a plurality of sub-steps. In some examples, a first sub-step includes directing a first portion of the cool fluid in the first body section to generate the first portion of the partially hot fluid. In some examples, the first portion of the cool fluid absorbs the waste-heat from the plurality of second electronic chips of a second electronic chipset, arranged along a first row, and generates the first portion of the partially hot fluid. A second sub-step includes directing a second portion of the cool fluid in the second body section to generate the second portion of the partially hot fluid. In some examples, the first portion of the cool fluid absorbs the waste-heat from the plurality of second electronic chips of the second electronic chipset, arranged along a second row, and generates the second portion of the partially hot fluid. In one or more examples, the first and second portions of the cool fluid are directed in parallel to each other. In some examples, each electronic chip of the plurality of second electronic chips may include a memory chip. A third sub-step includes directing a mixed portion of the partially hot fluid in the third body section to absorb the waste-heat from the third electronic chip of the second electronic chipset, and generate the partially hot fluid, where the mixed portion of the partially hot fluid is a mixture of the first and second portions of the partially hot fluid. In some examples, the third electronic chip may include a graphics processing unit (GPU) chip. The method continues to block 608.

As discussed hereinabove, in some examples, the plurality of second electronic chips has a second case temperature "$T_2$", and the third electronic chip has a third case temperature "$T_3$". It may be noted herein that the term "case temperature" may refer to maximum temperature that the electronic chip may attain while operating to execute the assigned task or workload. In some examples, the second case temperature "$T_2$" is greater than the third case temperature "$T_3$". Since the third case temperature "$T_3$" is smaller than the second case temperature "$T_2$", the first fluid channel 192 is designed such that the cool fluid is first directed into the first body section and second body section of the body section, to absorb the waste-heat from the plurality of second electronic chips, and then the partially hot fluid is directed in the third body section of the body section, to absorb the waste-heat from the third electronic chip. In some examples, the body section is first bifurcated into two channels, for examples, the first body section and the second body section in order to i) direct the cool fluid simultaneously to the plurality of second electronic chips arranged along two parallel rows, and ii) increase velocity of the cool fluid to improve a cooling efficiency over the plurality of second electronic chips (i.e., memory chips). In some examples, the velocity of the cool fluid may be increased due to decease in flow area by the bifurcation of the first fluid channel. Later, the first body and second body sections are joined or merged together to form the third body section so as to increase the velocity of the partially hot fluid to further improve the cooling efficiency over the third electronic chip (i.e., high power GPU chip).

At block 608, the method 600 includes discharging the partially hot fluid from the first fluid channel into an intermediate fluid channel of a first cooling component of the cooling module, via an inlet fluid-flow path established between the first and second cooling components. In some examples, the first cooling component is positioned within a recess portion of the second cooling component, and connected to the frame to establish a first thermal interface with a first electronic chipset of the electronic circuit module. The method continues to block 610.

At block 610, the method 600 includes directing the partially hot fluid in the intermediate fluid channel to absorb the waste-heat from the first electronic chipset, and generate a hot fluid. The first electronic chipset may include the first electronic chip, such as a central processing unit (CPU) chip. In some examples, the first electronic chip has a first case temperature "$T_1$". In some examples, the first case temperature "$T_1$" is greater than the second case temperature "$T_2$" and the third case temperature "$T_3$". Since the first case temperature "$T_1$" is greater than the second case temperature "$T_2$" and the third case temperature "$T_3$", the first fluid channel is designed such that the partially hot fluid is directed into the intermediate fluid channel from the first fluid channel so as to effectively absorb the waste-heat from the first electronic chip and generate the hot fluid. In one or more examples, the intermediate fluid channel has a single-pass flow route, as the partially hot fluid has to only dissipate the waste-heat from the first electronic chip. The method continues to block 612. At block 612, the method 600 includes discharging the hot fluid from the intermediate fluid channel into a second fluid channel of the second cooling component via an outlet fluid-flow path established between the first and second cooling components. The method 600 continues to block 614. At block 614, the method 600 includes directing the hot fluid in the second fluid channel to the fluid outlet to return the hot fluid from the second cooling component. The method 600 ends at block 616.

Figure 7:
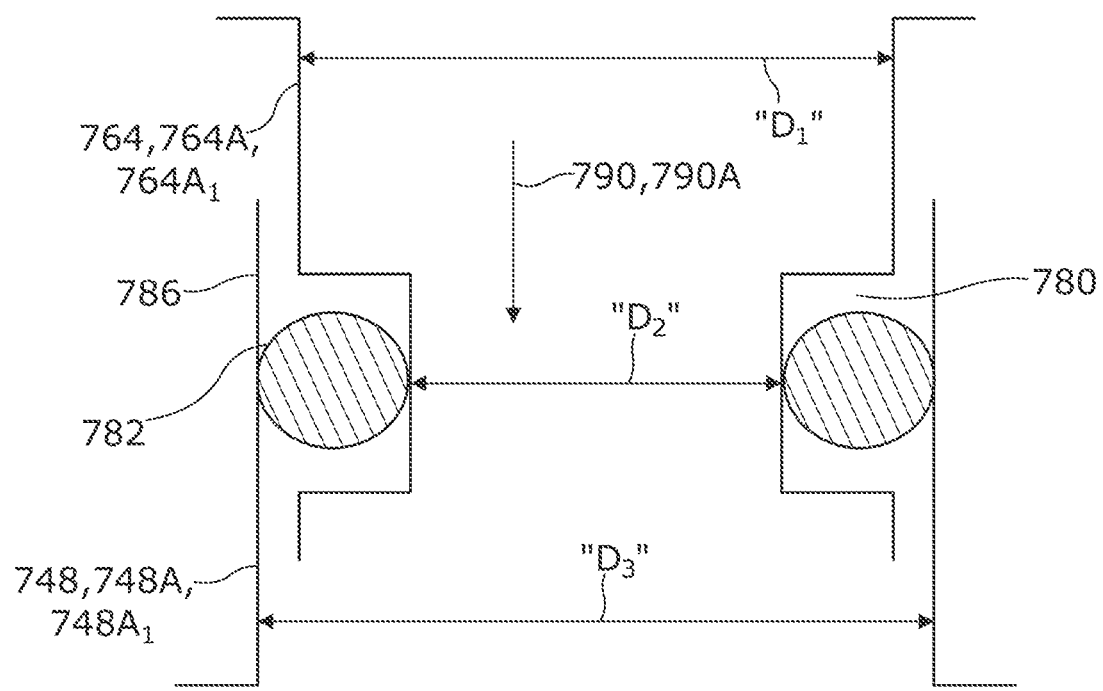
FIG. 7 illustrates a cross sectional view of another first connector of a pair of second fluid connectors movably connected to a first connector of a pair of first fluid connectors according to another example implementation of the present disclosure.

FIG. 7 is a cross sectional view of another first connector 764A of a pair of second fluid connectors 764 movably connected to a first connector 748A of a pair of first fluid connectors 748 according to another example implementation of the present disclosure. In some examples, the other first connector 764A is a fluid piston $764A_1$. In such examples, the fluid piston $764A_1$ has a first diameter "$D_1$", and an outer circumferential groove 780 formed on a portion of the fluid piston $764A_1$ has a second diameter "$D_2$". In some examples, the first diameter "$D_1$" is greater than the second diameter "$D_2$". In some examples, a cooling module further includes an O-ring seal 782 disposed in the outer circumferential groove 780 of the fluid piston $764A_1$. In some examples, the first connector 748A is a fluid bore $748A_1$. In such examples, the fluid bore $748A_1$ has a wall 786 (or circumferential wall) having a second diameter "$D_3$". In some examples, the third diameter "$D_3$" is greater than the first diameter "$D_1$".

In one or more examples, the other first connector 764A of the pair of second fluid connectors 764A is movably connected to the first connector 748A of the pair of first fluid connectors 748 to establish a fluid-flow path 790 between a second cooling component and a first cooling component respectively, of the cooling module. In other words, the fluid piston $764A_1$ is movably connected to the fluid bore $748A_1$ to establish the fluid-flow path 790 therebetween, for example, an inlet fluid-flow path 790A. For example, the fluid piston $764A_1$ is inserted inside the wall 786 of the fluid bore $748A_1$ such that the O-ring seal 782 is compressed against the wall 786 of the fluid bore $748A_1$. In some examples, the O-ring seal 782 is compressed against the wall 786 of the fluid bore $748A_1$, upon movably connecting the fluid piston $764A_1$ to the fluid bore $748A_1$, to prevent leakage of a fluid from the fluid-flow path 790.

In accordance to the present implementation, the proposed cooling module may establish a sufficient thermal interface between the cooling components and the electronic chips to enable efficient heat transfer from the electronic chips irrespective of variations in the height and the flatness between the electronic chips. Further, since each connector of the pair of the first fluid connectors or each connector of the pair of second fluid connectors has the O-ring seal, the second cooling component may be permitted to independently move relative to the first cooling component. In other words, the O-ring seal may permit a 3-dimensional movement of the second cooling component relative to the first cooling component in order to accommodate the variations in at least one of the height or the flatness between the first and second electronic chips. The cooling module may be construed as a monolithic cooling module due to the floatable (movable) design of the second cooling component disposed on the first cooling component, which may minimize cracking of electronic chips at the time of installation and/or during shipping/handling, and in the field. Further, the floating capability of the second cooling component may help to accommodate variations in height and co-planarity (flatness) tolerances between two adjacent electronic chips minimizing raised areas or indentations. Additionally, since the spring loaded fasteners are used to connect the cooling component to the frame, the cooling module may provide improved factory installation, and an improved field and factory servicing experience. The usage of the captive fasteners (or set screws) to lock the floating of the second cooling component in place after it is positioned on the respective electronic chips, may ensure that electronic chips are not damaged due to fluid pressure force, during assembly, shipping, servicing, or the like.

Further, as discussed herein, the design of the first fluid channel in the second cooling component may significantly increase a velocity of a fluid, thereby increasing a cooling efficiency of a high powered electronic chipset, and reducing a volumetric flow rate of the fluid directed within the cooling module. In other words, the first fluid channel having the circuitous or the tortuous flow route may enable the fluid to be directed within the second cooling component at a high velocity for a low volumetric flow rate, thereby assist in efficient dissipation of the waste-heat from the second electronic chipset. Additionally, the design of the intermediate flow channel in the first cooling component may decrease the velocity of the fluid, thereby increasing the cooling efficiency of a low powered electronic chipset, and reducing the volumetric flow rate of the fluid directed within the cooling module, thereby assist in efficient dissipation of the waste-heat from the second electronic chipset. Accordingly, the fluid channels in the first and second cooling components may enable the cooling module to have the volumetric flow rate of about 0.12 gallons per minutes. Accordingly, a thermal management unit of the datacenter environment, having a coolant distribution unit (CDU) to distribute the coolant fluid, may be provisioned to supply the cool fluid to at least four racks, each rack having about thirty-two server systems, and each server system having about eight circuit assemblies, and each circuit assembly having at least one cooling module.

Additionally, various features as illustrated in the examples described herein may be implemented as a tool-less method of quickly and easily assembling/disassembling a cooling module to an electronic circuit module by a technician or a customer, thus reducing the down time of the server system and efforts associated to such events of assembling and disassembling the cooling module to the electronic circuit module of the server system.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A cooling module for an electronic circuit module, comprising:
   a first cooling component comprising a pair of first fluid connectors; and
   a second cooling component comprising a recess portion and a pair of second fluid connectors located in the recess portion,
   wherein the first cooling component is connectable to a frame supporting the electronic circuit module, to establish a first thermal interface between the first cooling component and a first chipset of the electronic circuit module, wherein the second cooling component is mounted on the frame such that the first cooling component is positioned within the recess portion, and each connector of the pair of first fluid connectors is movably connected to a respective connector of the pair of second fluid connectors to establish a fluid-flow path between the first and second cooling components, wherein the second cooling component is connectable to the frame to establish a second thermal interface between the second cooling component and a second chipset of the electronic circuit module.

2. The cooling module of claim 1, further comprising a plurality of first spring loaded fasteners and a plurality of second spring loaded fasteners, wherein the first cooling component is connectable to the frame by the plurality of first spring loaded fasteners to establish the first thermal interface with the first chipset, and wherein the second cooling component is connectable to the frame by the plurality of second spring loaded fasteners to establish the second thermal interface with the second chipset.

3. The cooling module of claim 1, wherein the second cooling component moves independently relative to the first cooling component, upon mounting of the second cooling component to the frame, to accommodate variations in at least one of a height or a flatness between the first chipset and the second chipset.

4. The cooling module of claim 3, wherein the second cooling component tilts relative to the first cooling component to align with a surface of the first cooling component to accommodate a variation in the flatness between the first chipset and the second chipset.

5. The cooling module of claim 3, wherein the second cooling component moves up and down relative to the first cooling component to accommodate a variation in the height between the first chipset and the second chipset.

6. The cooling module of claim 3, wherein the second cooling component has a plurality of holes located in the recess portion, wherein the first cooling component further comprises a plurality of retention tabs aligned to the plurality of holes, and wherein each retention tab of the plurality of retentions tabs protrudes along a respective hole of the plurality of holes, upon mounting the second cooling component on the frame, to align the second cooling component with the first cooling component.

7. The cooling module of claim 6, further comprising a plurality of captive fasteners, wherein each captive fastener of the plurality of captive fasteners is fastened to a respective retention tab of the plurality of retention tabs to couple the first and second cooling components to each other.

8. The cooling module of claim 3, wherein each connector of the pair of first fluid connectors is one of a fluid piston or a fluid bore, and wherein each connector of the pair of second fluid connectors is the other one of the fluid piston or the fluid bore.

9. The cooling module of claim 8, further comprising an O-ring seal disposed in an outer circumferential groove of the fluid piston, and wherein the O-ring seal is compressed against a wall of the fluid bore, upon movably connecting the fluid piston to the fluid bore, to prevent leakage of a fluid from the fluid-flow path established between the first and second cooling components.

10. The cooling module of claim 9, wherein the O-ring seal slides along the wall of the fluid bore by an up and down movement of the second cooling component relative to the first cooling component, eccentrically compresses against the wall of the fluid bore by a tilting movement of the second cooling component relative to the first cooling component, or a combination thereof.

11. A circuit assembly for an electronic system, comprising:
a frame;
an electronic circuit module comprising a first chipset and a second chipset disposed on a circuit board of the electronic circuit module, wherein the electronic circuit module is coupled to the frame; and
a cooling module comprising:
a first cooling component comprising a pair of first fluid connectors; and
a second cooling component comprising a recess portion and a pair of second fluid connectors located in the recess portion,
wherein the first cooling component is connected to the frame to establish a first thermal interface between the first cooling component and the first chipset, wherein the second cooling component is mounted on the frame such that the first cooling component is positioned within the recess portion, and each connector of the pair of first fluid connectors is movably connected to a respective connector of the pair of second fluid connectors to establish a fluid-flow path between the first and second cooling components, and wherein the second cooling component is connected to the frame to establish a second thermal interface between the second cooling component and the second chipset.

12. The circuit assembly of claim 11, wherein the cooling module further comprises a plurality of first spring loaded fasteners and a plurality of second spring loaded fasteners, wherein the first cooling component is connected to the frame by the plurality of first spring loaded fasteners to establish the first thermal interface with the first chipset, and wherein the second cooling component is connected to the frame by the plurality of second spring loaded fasteners to establish the second thermal interface with the second chipset.

13. The circuit assembly of claim 11, wherein the second cooling component moves independently relative to the first cooling component, upon mounting of the second cooling component to the frame, to accommodate variations in at least one of a height or a flatness between the first chipset and the second chipset.

14. The circuit assembly of claim 13, wherein the second cooling component tilts relative to the first cooling component to align with a surface of the first cooling component to accommodate a variation in a flatness between the first chipset and the second chipset, and wherein the second cooling component moves up and down relative to the first cooling component to accommodate the variation in a height between the first chipset and the second chipset.

15. The circuit assembly of claim 13, wherein the cooling module further comprises a plurality of captive fasteners, wherein the second cooling component has a plurality of holes located in the recess portion, wherein the first cooling component further comprises a plurality of retention tabs aligned to the plurality of holes, wherein each retention tab of the plurality of retentions tabs protrudes along a respective hole of the plurality of holes, upon mounting the second cooling component on the frame, to align the second cooling component with the first cooling component, and wherein each captive fastener of the plurality of captive fasteners is fastened to a respective retention tab of the plurality of retention tabs to couple the first and second cooling components to each other.

16. The circuit assembly of claim 13, wherein the cooling module further comprises an O-ring seal, wherein each connector of the pair of first fluid connectors is one of a fluid piston or a fluid bore, wherein each connector of the pair of second fluid connectors is the other one of the fluid piston or the fluid bore, wherein the O-ring seal is disposed in an outer circumferential groove of the fluid piston, wherein the O-ring seal is compressed against a wall of the fluid bore, upon movably connecting the fluid piston to the fluid bore, to prevent leakage of a fluid from the fluid-flow path established between the first and second cooling components.

17. The circuit assembly of claim 16, wherein the O-ring seal slides along the wall of the fluid bore by an up and down movement of the second cooling component relative to the first cooling component, eccentrically compresses against the wall of the fluid bore by a tilting movement of the second cooling component relative to the first cooling component, or a combination thereof.

18. A method of assembling a cooling module to an electronic circuit module of a circuit assembly, the method comprising:
coupling the electronic circuit module to a frame of the circuit assembly, wherein the electronic circuit module comprises a circuit board, and a first chipset and a second chipset disposed on the circuit board;
connecting a first cooling component of the cooling module, to the frame to establish a first thermal interface between the first cooling component and the first chipset;
positioning a second cooling component of the cooling module over the first cooling component to align a plurality of holes of the second cooling component to a plurality of retention tabs of the first cooling component;
mounting the second cooling component on the frame such that the first cooling component is positioned within a recess portion of the second cooling component, each retention tab of the plurality of retention tabs protrudes along a respective hole of the plurality of holes, and each connector of a pair of first fluid connectors in the first cooling component is movably connected to a respective connector of a pair of second fluid connectors in the second cooling component to establish a fluid-flow path between the first and second cooling components; and
connecting the second cooling component to the frame to establish a second thermal interface between the second cooling component and the second chipset.

19. The method of claim 18, wherein mounting the second cooling component on the frame comprises moving the second cooling component independently relative to the first cooling component to accommodate variations in at least one of a height or a flatness between the first chipset and the second chipset.

20. The method of claim 19, wherein moving the second cooling component independently relative to the first cooling component comprises tilting the second cooling component relative to the first cooling component to align with a surface of the first cooling component to accommodate a variation in the flatness between the first chipset and the second chipset, and wherein moving the second cooling component independently relative to the first cooling component further comprises moving the second cooling component up and down relative to the first cooling component, to accommodate the variation in the height between the first chipset and the second chipset.

* * * * *